(12) United States Patent
Chung et al.

(10) Patent No.: US 11,839,103 B2
(45) Date of Patent: Dec. 5, 2023

(54) DISPLAY APPARATUS AND METHOD OF MANUFACTURING THE SAME

(71) Applicant: Samsung Display Co., Ltd., Yongin-si (KR)

(72) Inventors: Jinkoo Chung, Yongin-si (KR);
Beohmrock Choi, Yongin-si (KR);
Jiyoung Choung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/562,964

(22) Filed: Dec. 27, 2021

(65) Prior Publication Data
US 2022/0123260 A1    Apr. 21, 2022

Related U.S. Application Data

(62) Division of application No. 16/688,784, filed on Nov. 19, 2019, now Pat. No. 11,239,446.

(30) Foreign Application Priority Data

Mar. 12, 2019    (KR) .................... 10-2019-0028378

(51) Int. Cl.
*H01L 51/52*    (2006.01)
*H01L 27/32*    (2006.01)
(Continued)

(52) U.S. Cl.
CPC ......... *H10K 50/844* (2023.02); *H10K 50/822* (2023.02); *H10K 59/122* (2023.02);
(Continued)

(58) Field of Classification Search
CPC ............ H01L 51/5253; H01L 27/3246; H01L 27/3258; H01L 51/0096; H01L 51/5225; H01L 51/56; H01L 2227/323; H01L 27/326; H01L 51/0056; H01L 51/0053; H01L 51/0097; H01L 27/3227; H01L 27/3225; H01L 27/3244; Y02E 10/549; G06F 1/1637; G06F 1/1626;
(Continued)

(56) References Cited

U.S. PATENT DOCUMENTS 6,369,495 B2    4/2002    Codama et al.
8,816,331 B2    8/2014    Choi et al.
(Continued)

FOREIGN PATENT DOCUMENTS

EP    3139411 A1    3/2017
EP    3176772 A1    6/2017
(Continued)

*Primary Examiner* — Cuong B Nguyen
(74) *Attorney, Agent, or Firm* — Lewis Roca Rothgerber Christie LLP

(57) ABSTRACT

A display apparatus including a substrate including a display area and a sensor area, the sensor area including a transmission portion that transmits light, a plurality of first display devices arranged in the display area, a display device group including a plurality of second display devices, the display device group being arranged in the sensor area, and a passivation layer covering the display device group and having a first hole corresponding to the transmission portion.

8 Claims, 20 Drawing Sheets

(51) Int. Cl.
*H10K 50/844* (2023.01)
*H10K 50/822* (2023.01)
*H10K 59/122* (2023.01)
*H10K 59/124* (2023.01)
*H10K 71/00* (2023.01)
*H10K 77/10* (2023.01)
*H10K 59/12* (2023.01)

(52) U.S. Cl.
CPC ........... *H10K 59/124* (2023.02); *H10K 71/00* (2023.02); *H10K 77/10* (2023.02); *H10K 59/1201* (2023.02)

(58) Field of Classification Search
CPC .. G06F 1/1684; H10K 50/844; H10K 50/822; H10K 59/122; H10K 59/124; H10K 71/00; H10K 77/10; H10K 59/1201; H10K 77/111; H10K 59/00; H10K 59/121; H10K 85/621; H10K 85/624; H10K 59/60; H10K 59/12; H10K 50/858; H10K 59/35; H10K 50/84; Y02P 70/50
See application file for complete search history.

(56) References Cited

U.S. PATENT DOCUMENTS

| | | |
|---|---|---|
| 9,761,647 B2 | 9/2017 | Lee et al. |
| 10,121,842 B2 * | 11/2018 | Lee ...................... A61B 5/0077 |
| 2017/0288003 A1 | 10/2017 | Kim et al. |
| 2018/0129328 A1 | 5/2018 | Park et al. |
| 2018/0151834 A1 | 5/2018 | Kanaya |
| 2018/0190907 A1 | 7/2018 | Kim et al. |
| 2018/0315357 A1 | 11/2018 | Nam et al. |
| 2019/0198585 A1 | 6/2019 | Chang et al. |

FOREIGN PATENT DOCUMENTS

| | | |
|---|---|---|
| EP | 3664143 a2 | 6/2020 |
| KR | 10-2012-0124224 A | 11/2012 |
| KR | 10-2018-0050473 A | 5/2018 |
| KR | 10-2018-0080416 A | 7/2018 |

* cited by examiner

DISPLAY APPARATUS AND METHOD OF MANUFACTURING THE SAME

CROSS-REFERENCE TO RELATED APPLICATIONS

This application is a divisional of U.S. patent application Ser. No. 16/688,784, filed Nov. 19, 2019, which claims priority to and the benefit of Korean Patent Application No. 10-2019-0028378, filed Mar. 12, 2019, the entire content of both of which is incorporated herein by reference.

BACKGROUND

1. Field

Aspects of the present invention relate to a display apparatus and a method of manufacturing the display apparatus.

2. Description of the Related Art

Applications of conventional display devices have diversified. Moreover, their range of use has increased due, in part, to the relatively small thickness and relatively light weight of the display apparatuses.

The area occupied by display areas of display apparatuses has increased, and various functions connected or linked to display apparatuses have been added to display apparatuses. To increase the display areas and to add various functions, display apparatuses capable of having various components arranged in a display area have been researched.

SUMMARY

Aspects of some embodiments are directed to a display apparatus including, inside a display area, a sensor area in which a sensor and the like may be arranged, and a method of manufacturing the display apparatus. Additional aspects will be set forth in part in the description which follows and, in part, will be apparent from the description, or may be learned by practice of the presented embodiments.

According to some embodiments, there is provided a display apparatus including: a substrate including a display area and a sensor area, the sensor area including a transmission portion that transmits light; a plurality of first display devices arranged in the display area; a display device group including a plurality of second display devices, the display device group being arranged in the sensor area; and a passivation layer covering the display device group and having a first hole corresponding to the transmission portion.

In some embodiments, each of the plurality of second display devices includes a pixel electrode, an emission layer on the pixel electrode, and an opposite electrode on the emission layer.

In some embodiments, the passivation layer is on the opposite electrode, and wherein the opposite electrode has a second hole corresponding to the transmission portion, and an area of the second hole is greater than an area of the first hole.

In some embodiments, the passivation layer covers the display device group and has first patterns spaced from each other with the first hole between the first patterns, wherein the opposite electrode corresponds to the display device group and has second patterns spaced from each other with the second hole between the first patterns, and wherein an end of one of the first patterns on a side of the first hole covers an end of one of the second patterns on a side of the second hole.

In some embodiments, the display apparatus further includes: an organic insulating layer between the substrate and the pixel electrode; and a pixel defining layer between the organic insulating layer and the opposite electrode and having an opening that exposes at least a portion of the pixel electrode.

In some embodiments, the pixel defining layer has a third hole corresponding to the transmission portion, and wherein the organic insulating layer has a fourth hole corresponding to the transmission portion.

In some embodiments, the display apparatus further includes a plurality of insulating layers between the substrate and the organic insulating layer, wherein the plurality of insulating layers are below the fourth hole and has a fifth hole corresponding to the transmission portion.

In some embodiments, the display apparatus further includes an encapsulation layer on the passivation layer, the encapsulation layer covering the plurality of first display devices and the plurality of second display devices and including an inorganic encapsulation layer and an organic encapsulation layer.

In some embodiments, the passivation layer includes a same material as the inorganic encapsulation layer.

In some embodiments, the display apparatus further includes an encapsulation substrate on the passivation layer, the encapsulation substrate covering the plurality of first display devices and the plurality of second display devices and opposite the substrate.

In some embodiments, the display apparatus further includes a filling material filled between the passivation layer and the encapsulation substrate, wherein the filling material has a refractive index between a refractive index of the passivation layer and a refractive index of the encapsulation substrate.

In some embodiments, the substrate further includes an opening area surrounded by the display area, and wherein the opening area includes a hole having a larger size than the transmission portion.

According to some embodiments, there is provided a method of manufacturing a display apparatus including a plurality of first display devices, a display device group including a plurality of second display devices, and a transmission portion that transmits light, the method including: forming a plurality of pixel electrodes on a substrate including a display area in which the plurality of first display devices are arranged and a sensor area in which the display device group and the transmission portion are arranged; forming a pixel defining layer on the plurality of pixel electrodes, the pixel defining layer having an opening exposing at least a portion of each of the plurality of pixel electrodes and a hole corresponding to the transmission portion; forming a sacrificial layer on the pixel defining layer; patterning the sacrificial layer such that at least some of the pixel electrodes of the display device group are exposed and the hole is covered; forming a passivation layer on the patterned sacrificial layer; and forming in the passivation layer a first hole corresponding to the transmission portion by removing the patterned sacrificial layer, wherein the passivation layer covers the display device group and has first patterns spaced from each other with the first hole between the first patterns.

In some embodiments, the patterning of the sacrificial layer includes: forming a photoresist layer on the sacrificial layer; and patterning the photoresist layer to correspond to the transmission portion, wherein the patterned sacrificial layer is formed by using a patterned photoresist layer such that a portion of the sacrificial layer corresponding to the transmission portion remains.

In some embodiments, the forming of the patterned sacrificial layer includes forming an undercut cross-section of the patterned sacrificial layer and the patterned photoresist layer.

In some embodiments, the forming of the passivation layer on the patterned sacrificial layer includes: forming an emission layer on the plurality of pixel electrodes and the patterned sacrificial layer; forming an opposite electrode on emission layer; and forming a passivation layer on the opposite electrode.

In some embodiments, the method further includes, before the forming of the plurality of pixel electrodes, forming a lower hole by removing a portion of at least one of a plurality of insulating layers formed on the substrate, the portion corresponding to the transmission portion.

In some embodiments, the method further includes forming, on the passivation layer, an encapsulation layer including an inorganic encapsulation layer and an organic encapsulation layer, wherein the encapsulation layer covers the display area and the sensor area.

In some embodiments, the method further includes arranging, on the passivation layer, an encapsulation substrate opposite the substrate, wherein the encapsulation substrate covers the display area and the sensor area.

In some embodiments, the method further includes forming a filling material filled between the passivation layer and the encapsulation substrate, wherein the filling material has a refractive index between a refractive index of the passivation layer and a refractive index of the encapsulation substrate.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
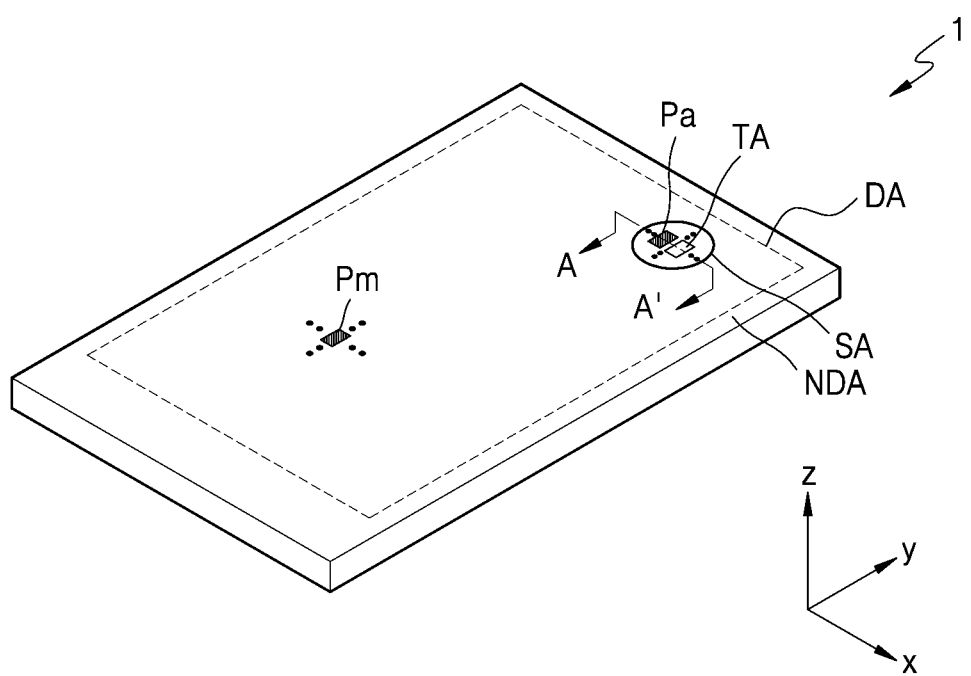
FIG. 1 is a schematic perspective view of a display apparatus according to an example embodiment of the present invention.

As the invention allows for various suitable changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the following description of the present invention, a detailed description of disclosed technologies will not be provided if they are deemed to make features of the invention obscure.

One or more embodiments will be described below in more detail with reference to the accompanying drawings. Those components that are substantially the same or are in correspondence are labeled with the same reference numeral regardless of the figure number, and redundant explanations may be omitted. In the drawings, the thicknesses of several layers and areas are magnified to clearly express the layers and areas. In the drawings, thicknesses of some layers and areas are exaggerated for convenience of explanation.

FIG. 1 is a schematic perspective view of a display apparatus 1 according to an embodiment.

Referring to FIG. 1, the display apparatus 1 includes a display area DA that displays an image, and a non-display area NDA that does not display an image. The display apparatus 1 may provide a main image by using light emitted from a plurality of main pixels Pm arranged in the display area DA.

The display apparatus 1 includes a sensor area SA. The sensor area SA may be an area having a lower portion in which a component such as a sensor using infrared light, visible light, or sound is arranged, as will be described later with reference to FIG. 2. The sensor area SA may include a transmission portion TA capable of transmitting light or/and sound that is output from a component to the outside or travels from the outside toward the component. According to an embodiment, when infrared light is transmitted through the sensor area SA, an infrared light transmittance in the sensor area SA may be about 10% or greater, for example, 20% or greater, 25% or greater, 50% or greater, 85% or greater, or 90% or greater.

According to the present embodiment, a plurality of auxiliary pixels Pa may be arranged in the sensor area SA, and a certain image may be provided using light emitted by the plurality of auxiliary pixels Pa. An image provided by the sensor area SA is an auxiliary image and thus may have lower resolution than an image provided by the display area DA. In other words, because the sensor area SA includes the transmission portion TA capable of transmitting light or/and sound, the number of auxiliary pixels Pa arranged on a unit area may be less than the number of main pixels Pm arranged on a unit area in the display area DA.

The sensor area SA may be at least partially surrounded by the display area DA. According to an embodiment, FIG. 1 illustrates the sensor area SA entirely surrounded by the display area DA.

Although an organic light-emitting display will now be illustrated and described as the display apparatus 1, the display apparatus 1 is not limited thereto. According to another embodiment, various types of display apparatuses, such as an inorganic light-emitting display and a quantum dot light-emitting display, may be used.

Although the sensor area SA is arranged on one side (e.g., the upper right side) of the display area DA having a rectangular shape in FIG. 1, embodiments are not limited thereto. The shape of the display area DA may be a circle, an oval, or a polygon, such as a triangle or a pentagon, and the location of the sensor area SA and the number of sensor areas SA may vary.

Figure 2:
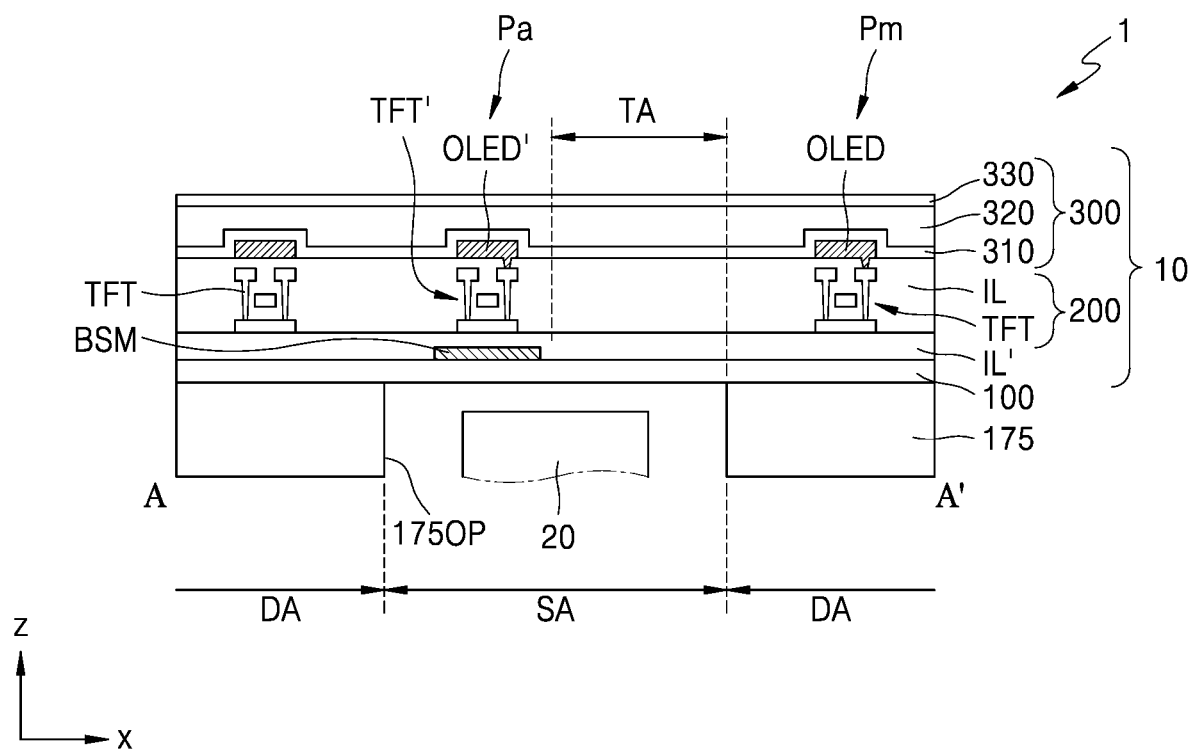
FIG. 2 is a cross-sectional view taken along the line A-A' of FIG. 1.

FIG. 2 is a cross-sectional view taken along the line A-A' of FIG. 1.

Referring to FIG. 2, the display apparatus 1 may include a display panel 10 including a display element, and a component 20 corresponding to the sensor area SA.

The display panel 10 may include a substrate 100, a display element layer 200 disposed on the substrate 100, and an encapsulation layer 300 being an encapsulation member that seals the display element layer 200. The display panel 10 may further include a lower protection film 175 arranged below the substrate 100.

The substrate 100 may include glass or polymer resin. When the substrate 100 includes polymer resin, the substrate 100 may have flexible, rollable, or bendable characteristics. The substrate 100 may have a multi-layered structure including a layer including polymer resin and an inorganic layer.

The display element layer 200 may include a circuit layer including main and auxiliary thin-film transistors TFT and TFT', main and auxiliary organic light-emitting diodes OLED and OLED' being display elements, and insulating layers IL and IL'. The display element layer 200 may include a circuit layer including main and auxiliary thin-film transistors TFT and TFT', main and auxiliary organic light-emitting diodes OLED and OLED' being display elements, and insulating layers IL and IL'.

In the display area DA, a main pixel Pm including the main thin-film transistor TFT and the main organic light-emitting diode OLED connected to the main thin-film transistor TFT may be arranged. In the sensor area SA, an auxiliary pixel Pa including the auxiliary thin-film transistor TFT' and the auxiliary organic light-emitting diode OLED' connected to the auxiliary thin-film transistor TFT', and wires WL may be arranged.

In the sensor area SA, the transmission portion TA having no auxiliary thin-film transistors TFT' and no display elements arranged therein may be arranged. The transmission portion TA may be understood as a transmission area that transmits light/signal emitted by the component 20 or light/signal incident upon the component 20.

The component 20 may be located in the sensor area SA. The component 20 may be an electronic element that uses light or sounds. For example, the component 20 may be a sensor that receives and uses light, like an infrared sensor, a sensor that outputs and senses light or sound to measure a distance or recognize a fingerprint or the like, a small lamp that outputs light, or a speaker that outputs sound. An electronic element using light may use light in various wavelength bands, such as visible light, infrared light, and ultraviolet light. A plurality of components 20 may be arranged in the sensor area SA. For example, a light-emitting device and a light-receiving device as the component 20 may be both included in a single sensor area SA. In some examples, both a light-emitting portion and a light-receiving portion may be included in a single component 20.

A lower electrode layer BSM may be arranged in the sensor area SA to correspond to the auxiliary pixel Pa. In other words, the lower electrode layer BSM may be arranged to an area below the auxiliary thin-film transistor TFT'. The lower electrode layer BSM may prevent or substantially prevent external light from reaching the auxiliary pixel Pa including the auxiliary thin-film transistor TFT' and the like. For example, the lower electrode layer BSM may prevent or substantially prevent light emitted from the component 20 from reaching the auxiliary pixel Pa. A static voltage or a signal is applied to the lower electrode layer BSM, and thus the lower electrode layer BSM may prevent or substantially prevent a pixel circuit from being damaged by electrostatic discharge.

The encapsulation layer 300 may include at least one inorganic encapsulation layer and at least one organic encapsulation layer. With regard to this, FIG. 2 illustrates first and second inorganic encapsulation layers 310 and 330 and an organic encapsulation layer 320 therebetween.

The first and second inorganic encapsulation layers 310 and 330 may include at least one inorganic insulating material, such as aluminum oxide, titanium oxide, tantalum oxide, hafnium oxide, zinc oxide, silicon oxide, silicon nitride, silicon oxynitride, and/or the like. The organic encapsulation layer 320 may include a polymer-based material. Examples of the polymer-based material may include acrylic resin, epoxy resin, polyimide, and polyethylene.

The lower protection film 175 may be attached to a lower surface of the substrate 100 and may support and protect the substrate 100. The lower protection film 175 may include an opening 175OP corresponding to the sensor area SA. The lower protection film 175 may improve the light transmittance of the sensor area SA by including the opening 175OP. The lower protection film 175 may include polyethylene terephthalate (PET) or polyimide (PI).

The sensor area SA may have a larger area than an area where the component 20 is arranged. Accordingly, the area of the opening 175OP included in the lower protection film 175 may not be identical with the area of the sensor area SA. For example, the area of the opening 175OP may be less than the area of the sensor area SA.

A component(s), such as an input sensing member for sensing a touch input, an anti-reflection member including a polarizer and a retarder, or a color filter and a black matrix, and a transparent window, may be arranged on the display panel 10.

According to the present embodiment, the encapsulation layer 300 is used as an encapsulation member that seals the display element layer 200, but embodiments are not limited thereto. For example, an encapsulation substrate coupled with the substrate 100 by a sealant or frit may be used as a member that seals the display element layer 200.

Figure 3:
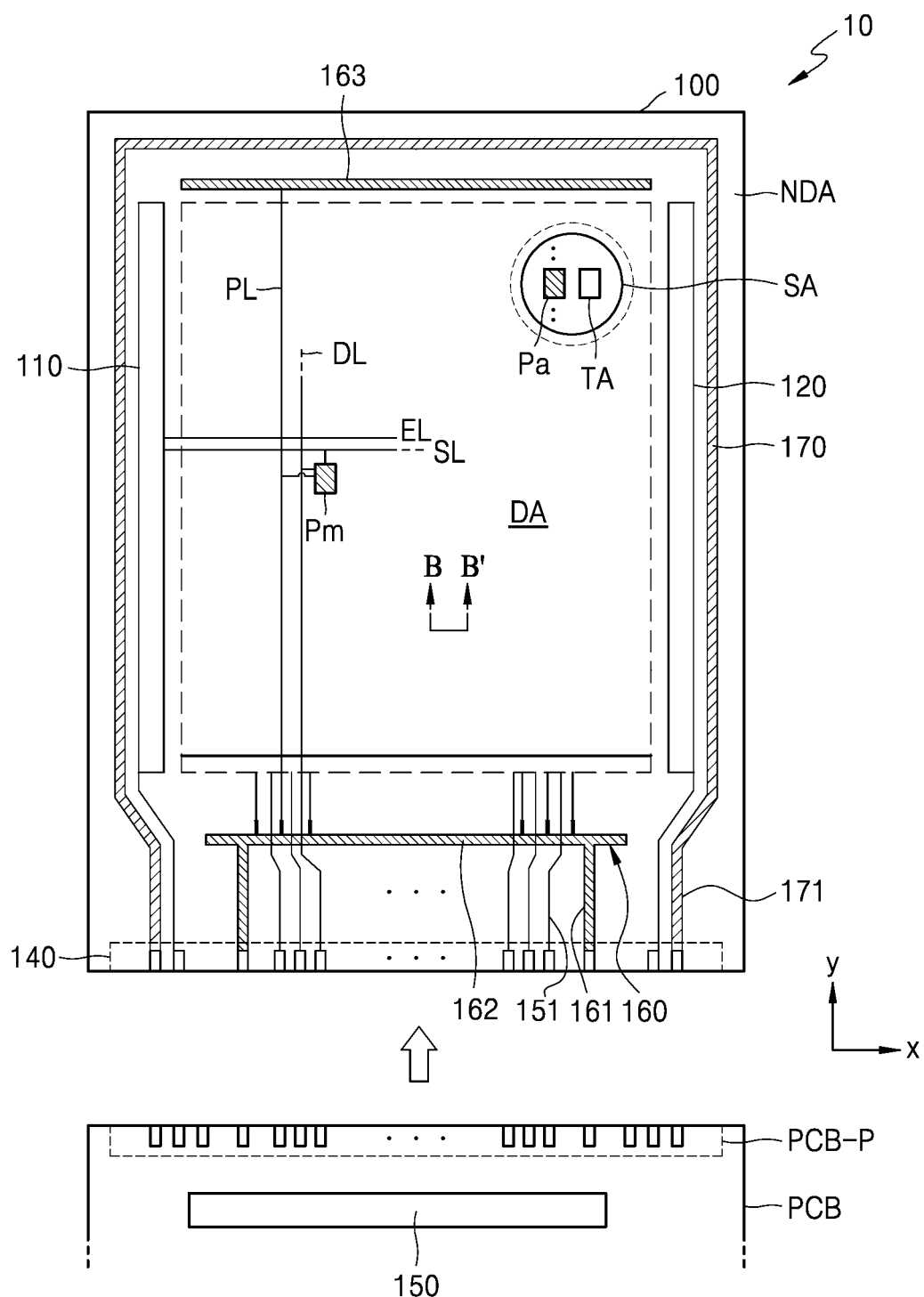
FIG. 3 is a schematic plan view of a display apparatus according to an embodiment.

FIG. 3 is a schematic plan view of the display panel 10 according to an embodiment.

Referring to FIG. 3, the display panel 10 is arranged in the display area DA and includes a plurality of main pixels Pm. Each of the main pixels Pm may include a display element such as an organic light-emitting diode. Each of the main pixels Pm may emit, for example, red light, green light, blue light, or white light, via the organic light-emitting diode. The main pixel Pm used herein may be understood as a pixel that emits one of red light, green light, blue light, and white light as described above. The display area DA may be protected from ambient air or moisture by being covered by the encapsulation member described above with reference to FIG. 2.

The sensor area SA may be arranged inside the display area DA, and a plurality of auxiliary pixels Pa are arranged in the sensor area SA. Each of the auxiliary pixels Pa may include a display element such as an organic light-emitting diode. Each of the auxiliary pixels Pa may emit, for example, red light, green light, blue light, or white light, via the organic light-emitting diode. The auxiliary pixel Pa used herein may be understood as a pixel that emits one of red light, green light, blue light, and white light as described above. In the sensor area SA, a transmission portion TA arranged between the auxiliary pixels Pa may be included.

According to an embodiment, one main pixel Pm and one auxiliary pixel Pa may include the same pixel circuit. However, embodiments are not limited thereto. The main pixel Pm and the auxiliary pixel Pa may include different pixel circuits.

Because the sensor area SA includes the transmission portion TA, the sensor area SA may have smaller resolution than the display area DA. For example, the resolution of the sensor area SA may be about ½ of the resolution of the display area DA. According to some embodiments, the display area DA may have a resolution of 400 ppi or greater, and the sensor area SA may have a resolution of about 200 ppi.

Each of the main and auxiliary pixels Pm and Pa may be electrically connected to outer circuits arranged in the non-display area NDA. In the non-display area NDA, a first scan driving circuit 110, a second scan driving circuit 120, a terminal 140, a data driving circuit 150, a first power supply line 160, and a second power supply line 170 may be arranged.

For example, the first scan driving circuit 110 may provide a scan signal to each of the main and auxiliary pixels Pm and Pa via a scan line SL. The first scan driving circuit 110 may provide a light-emission control signal to each pixel via a light-emission control line EL. The second scan driving circuit 120 may be arranged side by side with the first scan driving circuit 110 with the display area DA therebetween. Some of the main and auxiliary pixels Pm and Pa arranged in the display area DA may be electrically connected to the first scan driving circuit 110, and the others may be electrically connected to the second scan driving circuit 120. According to another embodiment, the second scan driving circuit 120 may not be included.

The terminal 140 may be disposed on one side of the substrate 100. The terminal 140 may be exposed without being covered by an insulating layer, and may be electrically connected to a printed circuit board PCB. A terminal PCB-P of the printed circuit board PCB may be electrically connected to the terminal 140 of the display panel 10. The printed circuit board PCB transmits a signal or power of a controller to the display panel 10. A control signal generated by the controller may be transmitted to each of the first and second scan driving circuits 110 and 120 via the printed circuit board PCB. The controller may provide first and second power supply voltages ELVDD and ELVSS to the first and second power supply lines 160 and 170 via first and second connection lines 161 and 171, respectively. The first power supply voltage ELVDD may be provided to each of the main and auxiliary pixels Pm and Pa via a driving voltage line PL connected to the first power supply line 160, and the second power supply voltage ELVSS may be pro-vided to an opposite electrode of each of the main and auxiliary pixels Pm and Pa connected to the second power supply line 170.

The data driving circuit 150 is electrically connected to a data line DL. A data signal of the data driving circuit 150 may be provided to each of the main and auxiliary pixels Pm and Pa via a connection line 151 connected to the terminal 140 and the data line DL connected to the connection line 151. In FIG. 3, the data driving circuit 150 is arranged on the printed circuit board PCB. However, according to another embodiment, the data driving circuit 150 may be arranged on the substrate 100. For example, the data driving circuit 150 may be between the terminal 140 and the first power supply line 160.

The first power supply line 160 may include a first sub-wire 162 and a second sub-wire 163 each extending in an x direction to be parallel to each other with the display area DA therebetween. The second power supply line 170 may partially surround the display area DA by having a loop shape of which one side is open.

Figure 4:
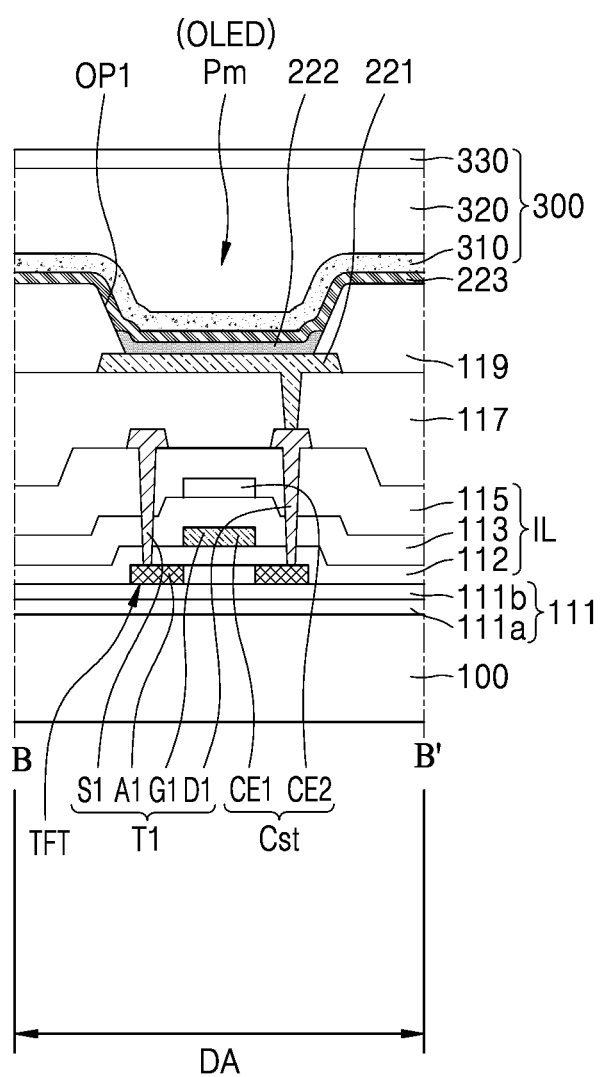
FIG. 4 is a cross-sectional view taken along the line B-B' of FIG. 3.

FIG. 4 is a cross-sectional view taken along the line B-B' of FIG. 3.

Referring to FIG. 4, a thin-film transistor TFT, a storage capacitor Cst, and a pixel electrode 221 electrically connected to the thin-film transistor TFT and the storage capacitor Cst are arranged on the display area DA of the substrate 100.

The substrate 100 may include polymer resin or glass. For example, the substrate 100 may include polymer resin, such as polyethersulphone, polyacrylate, polyetherimide, polyethylene naphthalate, polyethyelene terephthalate, polyphenylene sulfide, polyallylate, polyimide, polycarbonate, cellulose triacetate, cellulose acetate propionate, and/or the like. Thus, the substrate 100 may be flexible. The aforementioned polymer resin may be transparent.

The substrate 100 may include multiple layers, For example, the substrate 100 may include a barrier layer that prevents or substantially prevents infiltration of a foreign material, in addition to a layer including the aforementioned polymer resin. The barrier layer may be a single layer or multi-layer including an inorganic material, such as silicon nitride (SiNx) and/or silicon oxide (SiOx).

According to another embodiment, the substrate 100 may include a glass material containing SiO2 as a main component, or may include resin such as reinforced plastic. The substrate 100 may be rigid. The substrate 100 may have a structure in which the barrier layer is stacked on the layer including the aforementioned polymer resin. In this case, the substrate 100 may have improved flexibility. The barrier layer may include, for example, silicon nitride (SiNx), silicon oxynitride (SiON), and/or silicon oxide (SiOx).

A buffer layer 111 to prevent or substantially prevent infiltration of impurities into a semiconductor layer A1 of the thin-film transistor TFT may be arranged on the substrate 100. The buffer layer 111 may include an inorganic insulating material, such as silicon nitride, silicon oxynitride, silicon oxide, or the like, and may be a single layer or multiple layers including the inorganic insulating material. The buffer layer 111 may include a first buffer layer 111a and a second buffer layer 111b, one of which is stacked on the other.

A pixel circuit including the thin-film transistor TFT and the storage capacitor Cst is positioned on the buffer layer 111. The thin-film transistor TFT may include the semiconductor layer A1, a gate electrode G1, a source electrode S1, and a drain electrode D1. The thin-film transistor TFT of FIG. 4 may correspond to a driving thin-film transistor or a light-emission control thin-film transistor. According to the present embodiment, the thin-film transistor TFT is a top gate type in which the gate electrode G1 is arranged on the semiconductor layer A1 with a first gate insulating layer 112 therebetween. However, according to another embodiment, the thin-film transistor TFT may be a bottom gate type.

The semiconductor layer A1 may include polysilicon. In some examples, the semiconductor layer A1 may include, for example, amorphous silicon, an oxide semiconductor, or an organic semiconductor. The gate electrode G1 may include a low resistance metal material. The gate electrode G1 may include a conductive material including, for example, molybdenum (Mo), aluminum (Al), copper (Cu), titanium (Ti), and/or the like, and may be formed as a multi-layer or single layer including the aforementioned materials.

The first gate insulating layer 112 between the semiconductor layer A1 and the gate electrode G1 may include an inorganic insulating material, such as silicon oxide, silicon nitride, silicon oxynitride, aluminum oxide, titanium oxide, tantalum oxide, hafnium oxide, and/or the like. The first gate insulating layer 112 may be a single layer or multi-layer including the aforementioned materials.

The source electrode S1 and the drain electrode D1 may include a highly conductive material. Each of the source electrode S1 and the drain electrode D1 may include a conductive material including, for example, Mo, Al, Cu, Ti, and/or the like, and may be a multi-layer or single layer including the aforementioned materials. According to an embodiment, each of the source electrode S1 and the drain electrode D1 may be formed as a multi-layer of Ti/Al/Ti.

The storage capacitor Cst includes a lower electrode CE1 and an upper electrode CE2 with a second gate insulating layer 113 therebetween. The lower electrode CE1 and the upper electrode CE2 overlap each other. The storage capacitor Cst may be overlapped with the thin-film transistor TFT. With regard to this, FIG. 4 illustrates a case where the gate electrode G1 of the thin-film transistor TFT is the lower electrode CE1 of the storage capacitor Cst. According to another embodiment, the storage capacitor Cst may not be overlapped with the thin-film transistor TFT. The storage capacitor Cst may be covered by an interlayer insulating layer 115.

The second gate insulating layer 113 and the interlayer insulating layer 115 may include an inorganic insulating material, such as silicon oxide, silicon nitride, silicon oxynitride, aluminum oxide, titanium oxide, tantalum oxide, hafnium oxide, and/or the like. The second gate insulating layer 113 and the interlayer insulating layer 115 may be a single layer or multi-layer including the aforementioned materials.

The pixel circuit including the thin-film transistor TFT and the storage capacitor Cst may be covered by a planarization layer 117. An upper surface of the planarization layer 117 may include an approximately flat surface. The planarization layer 117 may include an organic insulating material, such as polymethyl methacrylate, polystyrene, a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, or a blend thereof. According to an embodiment, the planarization layer 117 may include polyimide. In some examples, the planarization layer 117 may include an inorganic insulating material or may include an inorganic insulating material and an organic insulating material.

The pixel electrode 221 may be on the planarization layer 117. The pixel electrode 221 may include conductive oxide, such as indium tin oxide (ITO), indium zinc oxide (IZO), zinc oxide (ZnO), indium oxide ($In_2O_3$), indium gallium oxide (IGO), aluminum zinc oxide (AZO), and/or the like. According to another embodiment, the pixel electrode 221 may include a reflection layer including, for example, silver (Ag), magnesium (Mg), aluminum (Al), platinum (Pt), palladium (Pd), gold (Au), nickel (Ni), neodymium (Nd), iridium (Ir), chromium (Cr), and/or the like, or a compound of these materials. According to another embodiment, the pixel electrode 221 may further include a film formed of ITO, IZO, ZnO, In2O3, and/or the like above/below the aforementioned reflection layer.

A pixel defining layer 119 may be arranged on the pixel electrode 221. The pixel defining layer 119 may include an opening through which an upper surface of the pixel electrode 221 is exposed, and may cover an edge of the pixel electrode 221. The pixel defining layer 119 may include an organic insulating material. In some examples, the pixel defining layer 119 may include an inorganic insulating material, such as silicon nitride (SiNx), silicon oxynitride (SiON), silicon oxide (SiOx), or the like. In some examples, the pixel defining layer 119 may include an organic insulating material and an inorganic insulating material.

An intermediate layer 222 includes an emission layer. The intermediate layer 222 may include a first functional layer below the emission layer, and/or a second functional layer above the emission layer. The emission layer may include a low molecular or high molecular organic material that emits light of a certain color.

The first functional layer may be a single layer or a multi-layer. For example, when the first functional layer is formed of a high molecular weight material, the first functional layer is a hole transport layer (HTL) having a single-layer structure, and may include poly-(3,4)-ethylene-dihydroxy thiophene (PEDOT) or polyaniline (PANI). On the other hand, when the first functional layer is formed of a low molecular weight material, the first functional layer may include a hole injection layer (HIL) and an HTL.

The second functional layer may be optional. For example, when the first functional layer and the emission layer are formed of a high molecular weight material, the second functional layer may be formed. The second functional layer may be a single layer or a multi-layer. The second functional layer may include an electron transport layer (ETL), and/or an electron injection layer (EIL).

The first and second functional layers of the intermediate layer 222 may be commonly formed in all pixels. The emission layer of the intermediate layer 222 may be arranged individually for each pixel in the display area DA. The emission layer may be arranged within an opening of the pixel defining layer 119.

An opposite electrode 223 may be formed of a conductive material having a low work function. For example, the opposite electrode 223 may include a (semi)transparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and/or the like, or an alloy of these materials. In some examples, the opposite electrode 223 may further include a layer, such as ITO, IZO, ZnO, $In_2O_3$, or the like, on the (semi)transparent layer including any of the above-described materials. The opposite electrode 223 may be formed commonly for all pixels and may be arranged in the display area DA and in the sensor area SA of FIG. 1. The intermediate layer 222 and the opposite electrode 223 may be formed via thermal deposition.

Figure 5:
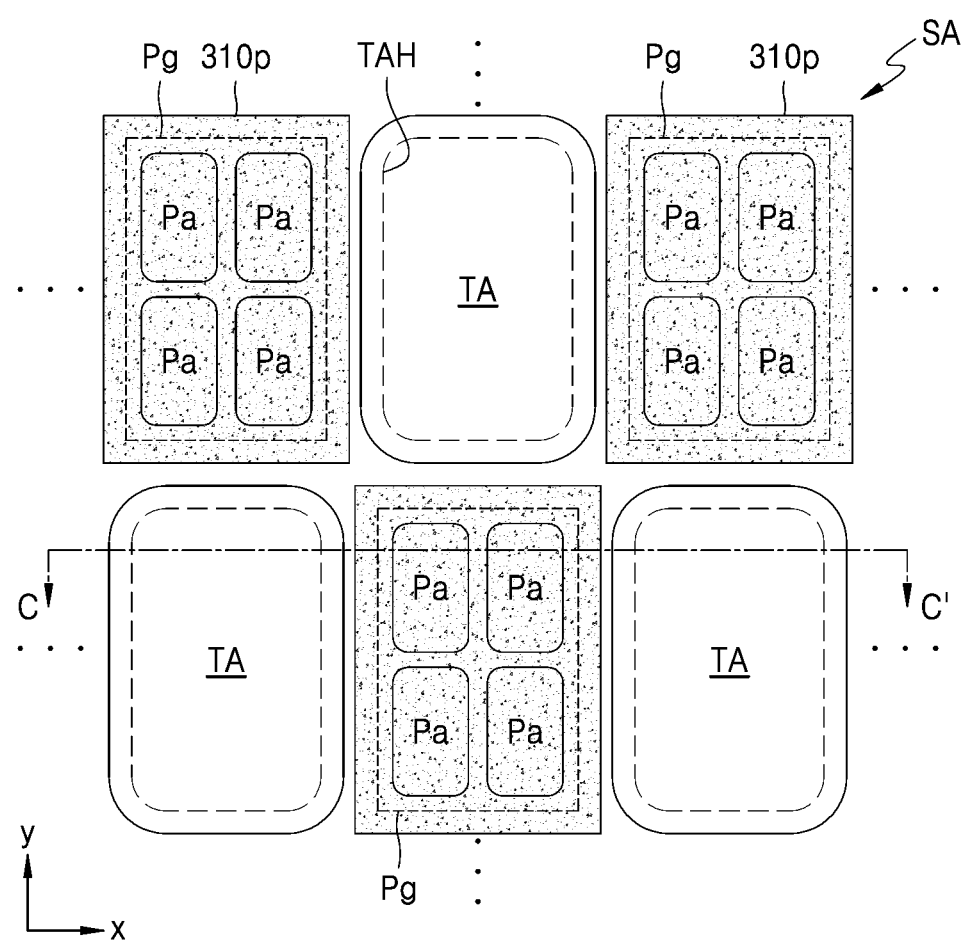
FIG. 5 is a schematic plan view of a portion of a sensor area of FIG. 3.
Figure 6:
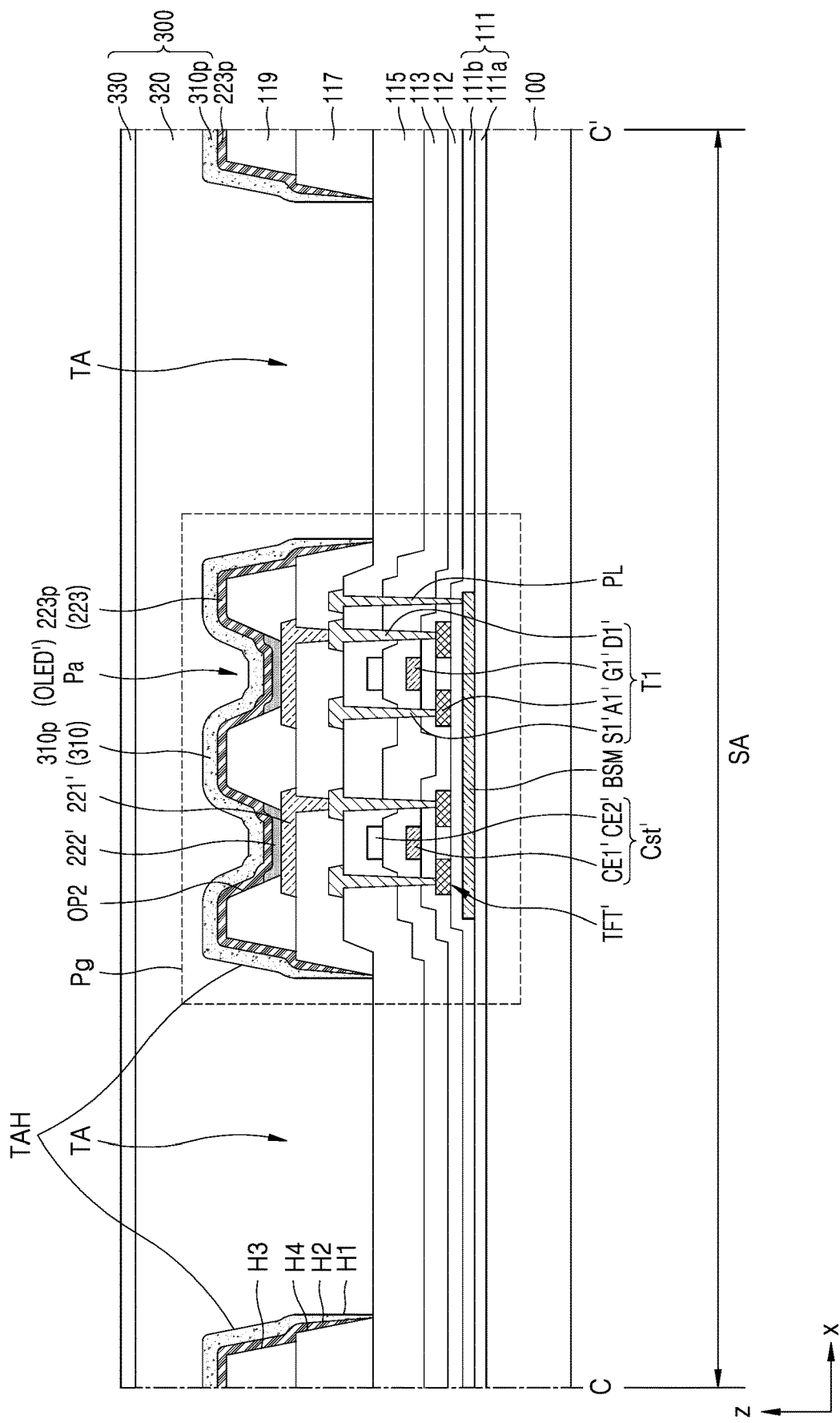
FIG. 6 is a cross-sectional view taken along the line C-C' of FIG. 5.

FIG. 5 is a schematic plan view of a portion of the sensor area SA of FIG. 3, and FIG. 6 is a cross-sectional view taken along the line C-C' of FIG. 5.

Referring to FIG. 5, auxiliary pixels Pa and transmission portions TA are arranged in the sensor area SA of the display apparatus 1 according to an embodiment. In this case, in each of the auxiliary pixels Pa, an auxiliary organic light-emitting diode OLED' of FIG. 6 electrically connected to a thin-film transistor TFT' of FIG. 6 and a storage capacitor Cst' of FIG. 6 may be arranged as a second display device.

Certain auxiliary pixels Pa may be consecutively arranged to constitute a single pixel group Pg. In other words, one or more auxiliary pixels Pa may be included in the pixel group Pg, and the pixel group Pg may be understood as a display device group which is an assembly of second display devices included in the auxiliary pixels Pa.

FIG. 5 illustrates four auxiliary pixels Pa arranged in two rows within one pixel group Pg. However, embodiments are not limited thereto. The number of auxiliary pixels Pa included in each pixel group Pg and an arrangement of the auxiliary pixels Pa may vary. For example, three auxiliary pixels Pa arranged in one row may be included in each pixel group Pg.

Each transmission portion TA is an area having a high light transmittance because no display elements are arranged therein, and a plurality of transmission portions TA may be included in the sensor area SA. The transmission portions TA may alternate with pixel groups Pg in a first direction (x direction) and/or a second direction (y direction). In some examples, transmission portions TA may be arranged to surround a pixel group Pg. In some examples, auxiliary pixels Pa may be arranged to surround a transmission portion TA.

According to the present embodiment, a passivation layer 310 covering the auxiliary pixels Pa is arranged in the sensor area SA. The passivation layer 310 may have first patterns 310p spaced apart from each other with a first hole H1 therebetween, and each of the first patterns 310p may be arranged for each pixel group Pg to cover a corresponding pixel group Pg.

The passivation layer 310 protects the auxiliary pixels Pa from ambient air or moisture and/or prevents or substantially prevents damage from being generated in the auxiliary pixels Pa in a subsequent process.

Referring to FIG. 6, a plurality of auxiliary pixels Pa and a plurality of transmission portions TA may be arranged in the sensor area SA of the display apparatus 1 according to an embodiment.

Each auxiliary pixel Pa may include an auxiliary thin-film transistor TFT' and an auxiliary storage capacitor Cst', and may further include an auxiliary organic light-emitting diode OLED' as a second display device. Each transmission portion TA may include a transmission hole TAH to correspond to the transmission portion TA.

The structures of the auxiliary thin-film transistor TFT', the auxiliary storage capacitor Cst', and the auxiliary organic light-emitting diode OLED' as components of each auxiliary pixel Pa are the same as or similar to the structures of the main thin-film transistor TFT, the main storage capacitor Cst, and the main organic light-emitting diode OLED described above with reference to FIG. 4 being components of each main pixel Pm. A difference between the components of the auxiliary pixel Pa and those of the main pixel Pm will now be focused on and described For example.

In the sensor area SA, the lower electrode layer BSM may be located between the first buffer layer 111a and the second buffer layer 111b. According to another embodiment, the lower electrode layer BSM may be located between the substrate 100 and the first buffer layer 111a. The lower electrode layer BSM may be located below the auxiliary thin-film transistor TFT' and may prevent characteristics of the auxiliary thin-film transistor TFT' from degrading due to light emitted from, for example, the component 20.

The lower electrode layer BSM may be connected to a wire arranged on a different layer, for example, the driving voltage line PL through a contact hole. The lower electrode layer BSM may receive a static voltage or a signal from the driving voltage line PL. For example, the lower electrode layer BSM may receive a first power supply voltage ELVDD or a scan signal. As the lower electrode layer BSM receives a static voltage or a signal, the probability that electrostatic discharge occurs may be significantly reduced. The lower electrode layer BSM may include aluminum (Al), platinum (Pt), palladium (Pd), silver (Ag), magnesium (Mg), gold (Au), nickel (Ni), neodymium (Nd), iridium (Ir), chromium (Cr), molybdenum (Mo), titanium (Ti), tungsten (W), copper (Cu), and/or the like. The lower electrode layer BSM may be a single layer or multi-layer including the aforementioned materials.

The lower electrode layer BSM may overlap a semiconductor layer A1' with the second buffer layer 111b therebetween. According to an embodiment, a width of the semiconductor layer A1' may be less than a width of the lower electrode layer BSM. Accordingly, when projection is performed in a direction perpendicular to the substrate 100, the semiconductor layer A1' may entirely overlap the lower electrode layer BSM.

The planarization layer 117 may have a fourth hole H4 corresponding to each transmission portion TA. The fourth hole H4 may be formed to expose an upper surface of the interlayer insulating layer 115. According to an embodiment, the planarization layer 117 may be an organic insulating layer including an organic material.

The pixel defining layer 119 may have a third hole H3 corresponding to each transmission portion TA, in addition to an opening OP2 exposing at least a portion of each pixel electrode 221', in order to define a light-emission area of each pixel. Accordingly, the fourth hole H4 of the planarization layer 117 is located below the third hole H3 of the pixel defining layer 119. According to an embodiment, the pixel defining layer 119 may include an organic insulating material.

An intermediate layer 222' including an organic emission layer may be arranged on the pixel electrode 221', and the opposite electrode 223 may be arranged on the intermediate layer 222'.

The opposite electrode 223 is arranged to cover at least a portion of an inner sidewall of the fourth hole H4 of the planarization layer 117 and at least a portion of an inner sidewall of the third hole H3 of the pixel defining layer 119, and thus the opposite electrode 223 may have a second hole H2 corresponding to the transmission portion TA.

The second hole H2 of the opposite electrode 223 may be located inside the fourth hole H4 and the third hole H3 by a thickness with which the opposite electrode 223 covers the fourth hole H4 and the third hole H3. Similar to the fourth hole H4, the second hole H2 may expose the upper surface of the interlayer insulating layer 115.

The opposite electrode 223 may be arranged to cover a pixel group Pg including a plurality of auxiliary pixels Pa. For example, the opposite electrode 223 may have second patterns 223p spaced apart from each other with the second hole H2 therebetween, and each of the second patterns 223*p* may be arranged for each pixel group Pg to cover a corresponding pixel group Pg.

A second pattern 223*p* of the opposite electrode 223 that covers the pixel group Pg may be formed to have a thickness that decreases in a direction toward an end of the second pattern 223*p*, namely, in a direction toward the upper surface of the interlayer insulating layer 115.

The passivation layer 310 may be arranged on the second pattern 223*p* of the opposite electrode 223. The passivation layer 310 is arranged to cover an inner sidewall of the second hole H2 of the opposite electrode 223, and thus has a first hole H1 corresponding to the transmission portion TA.

The first hole H1 of the passivation layer 310 may be located inside the second hole H2 by a thickness with which the passivation layer 310 covers the inner sidewall of the second hole H2. Similar to the second hole H2 of the opposite electrode 223 and the fourth hole H4 of the planarization layer 117, the first hole H1 may expose the upper surface of the interlayer insulating layer 115. According to the present embodiment, the first hole H1 of the passivation layer 310 may be the transmission hole TAH of the transmission portion TA.

Similar to the opposite electrode 223, the passivation layer 310 may be arranged to cover a pixel group Pg including a plurality of auxiliary pixels Pa. For example, the passivation layer 310 may have the first patterns 310*p* spaced apart from each other with the first hole H1 therebetween, and each of the first patterns 310*p* may be arranged for each pixel group Pg to cover a corresponding pixel group Pg.

A first pattern 310*p* of the passivation layer 310 that covers the pixel group Pg may be formed to have a thickness that decreases in a direction toward an end of the first pattern 310*p*, namely, in a direction toward the upper surface of the interlayer insulating layer 115.

As described above with reference to FIG. 5, the passivation layer 310 may protect the auxiliary pixels Pa from an external environment or an environment of a subsequent process. To this end, the passivation layer 310 may be arranged to cover an area corresponding to the entire surfaces of the inner sidewalls of the third and fourth holes H3 and H4 of the pixel defining layer 119 and the planarization layer 117 both including an organic material. An end of the first pattern 310*p* of the passivation layer 310 on the side of the first hole H1 may be formed to cover an end of the second pattern 223*p* of the opposite electrode 223 on the side of the second hole H2, and thus may prevent or substantially reduce infiltration of, for example, moisture or impurities into the intermediate layer 222' via the end on the side of the second hole H2.

As described above, as the third and fourth holes H3 and H4 are formed in the pixel defining layer 119 and the planarization layer 117, insulating layers including an organic material may be removed from the area of the transmission portion TA, and thus the light transmittance in the transmission portion TA may improve.

An encapsulation layer 300 including an inorganic encapsulation layer and an organic encapsulation layer may be arranged on the passivation layer 310. With respect to this, FIG. 6 illustrates the encapsulation layer 300 having a structure in which the first inorganic encapsulation layer 310, the organic encapsulation layer 320, and the second inorganic encapsulation layer 330 are stacked, and the passivation layer 310 functioning as the first inorganic encapsulation layer 310, which is a lowest layer of the encapsulation layer 300. According to another embodiment, the number of organic encapsulation layers, the number of inorganic encapsulation layers, and the order in which organic encapsulation layers and inorganic encapsulation layers are stacked may vary, and the passivation layer 310 may also include a plurality of layers.

According to the present embodiment, the passivation layer 310 functioning as the first inorganic encapsulation layer 310 may include at least one inorganic insulating material, such as at least one of aluminum oxide, titanium oxide, tantalum oxide, hafnium oxide, zinc oxide, silicon oxide, silicon nitride, silicon oxynitride, and may be formed via chemical vapor deposition (CVD) or the like.

The passivation layer 310 corresponding to the first inorganic encapsulation layer 310, the organic encapsulation layer 320, and the second inorganic encapsulation layer 330 may be integrally formed to cover the sensor area SA and the display area DA of FIG. 3. As the organic encapsulation layer 320 is arranged between the passivation layer 310 and the second inorganic encapsulation layer 330, the organic encapsulation layer 320 may be arranged within the transmission hole TAH.

According to another embodiment, the organic encapsulation layer 320 may be integrally formed to cover the display area DA and the sensor area SA, but may not exist in the transmission portion TA. In other words, the organic encapsulation layer 320 may include a hole corresponding to the transmission portion TA. In this case, the first inorganic encapsulation layer 310 and the second inorganic encapsulation layer 330 may contact each other within the transmission hole TAH.

Figure 7:
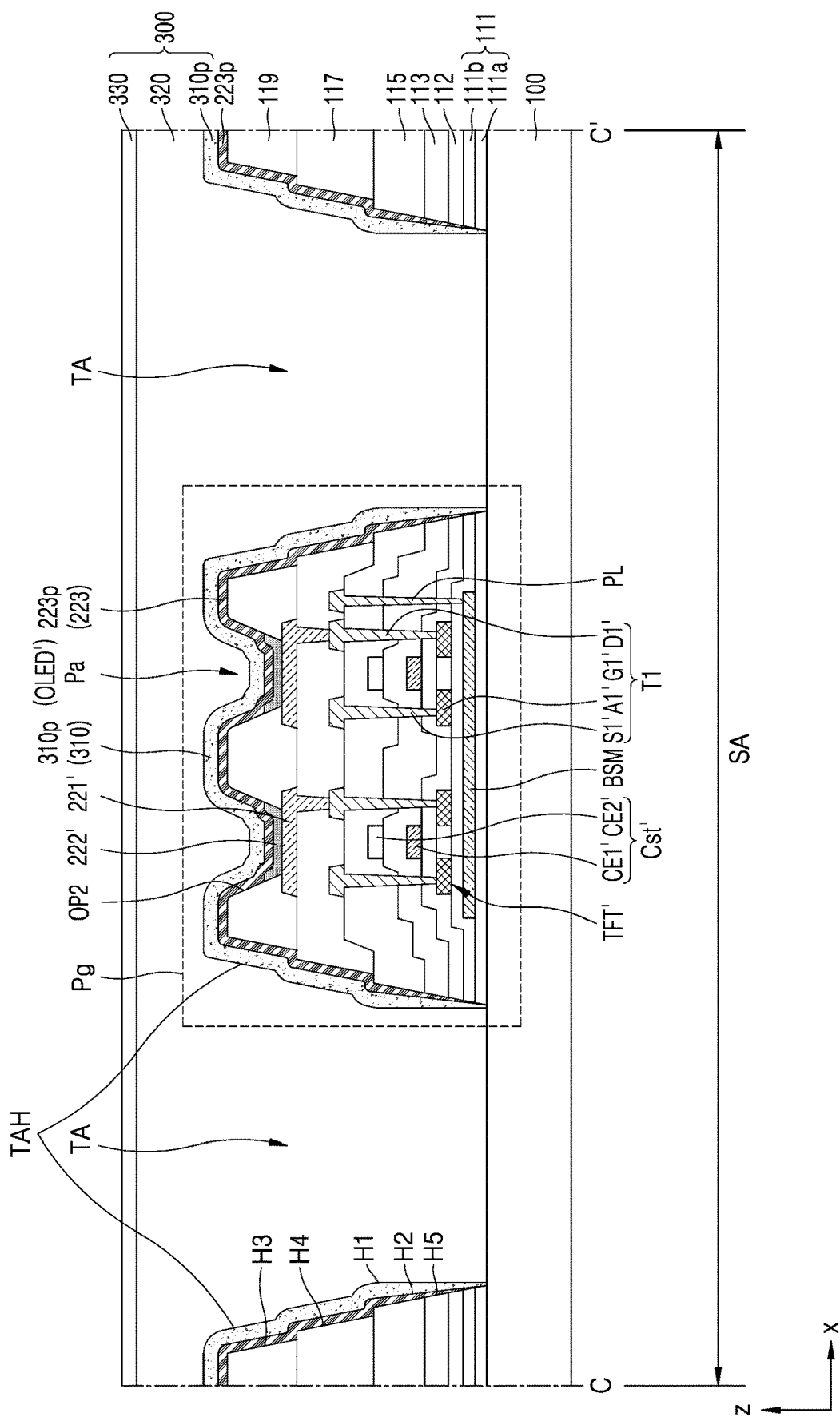
FIG. 7 is a schematic cross-sectional view of a display apparatus according to another example embodiment of the present invention.

FIG. 7 is a schematic cross-sectional view of a display apparatus according to another embodiment.

The embodiment of FIG. 7 has the same structure as or a similar structure to the embodiment of FIG. 6 except that a depth of the transmission hole TAH corresponding to the transmission portion TA is increased. Accordingly, the embodiment of FIG. 7 will now be described in detail by focusing on differences with the embodiment of FIG. 6.

Referring to FIG. 7, a fourth hole H4 may be formed in the planarization layer 117, a third hole H3 may be formed in the pixel defining layer 119, and the locations and shapes of the third and fourth holes H3 and H4 are as described above with reference to FIG. 6.

However, according to the present embodiment, like the pixel defining layer 119 and the planarization layer 117 both capable of including an organic material, an inorganic insulating layer IL such as the first gate insulating layer 112, the second gate insulating layer 113, and the interlayer insulating layer 115, may also include a hole corresponding to the transmission portion TA. The buffer layer 111 located below the inorganic insulating layer IL may also include a hole corresponding to each transmission portion TA.

According to an embodiment, the inorganic insulating layer IL and the buffer layer 111 may have a fifth hole H5 corresponding to each transmission portion TA. The inorganic insulating layer IL and the buffer layer 111 may be simultaneously perforated, and thus the fifth hole H5 may be formed via a single process. Dry etching or the like may be used as the single process.

Thus, the fifth hole H5 may be located below the fourth hole H4 of the planarization layer 117, and may expose an upper surface of the substrate 100 or an upper surface of a barrier layer between the substrate 100 and the buffer layer 111.

However, the fifth hole H5 is not limited to a hole that penetrates through from the buffer layer 111 to the interlayer insulating layer 115 via the first gate insulating layer 112 and the second gate insulating layer 113, and the fifth hole H5 may be a hole extending from the fourth hole H4 to at least one of the interlayer insulating layer 115, the second gate insulating layer 113, the first gate insulating layer 112, the second buffer layer 112a, and the first buffer layer 111a.

According to the present embodiment, the opposite electrode 223 is arranged to cover the fourth hole H4 of the planarization layer 117, the third hole H3 of the pixel defining layer 119, and at least a portion of an inner sidewall of the fifth hole H5 of the inorganic insulating layer IL and the buffer layer 111, and thus the opposite electrode 223 may have a second hole H2 corresponding to the transmission portion TA.

The opposite electrode 223 may have second patterns 223p spaced apart from each other with the second hole H2 therebetween, and each of the second patterns 223p may be arranged for each pixel group Pg to cover a corresponding pixel group Pg.

A second pattern 223p of the opposite electrode 223 that covers the pixel group Pg may be formed to have a thickness that decreases in a direction toward an end of the second pattern 223p, namely, in a direction toward the upper surface of the interlayer insulating layer 115.

The passivation layer 310 may be arranged on the second pattern 223p of the opposite electrode 223. The passivation layer 310 is arranged to cover an inner sidewall of the second hole H2 of the opposite electrode 223, and thus has a first hole H1 corresponding to the transmission portion TA. Also, according to the present embodiment, the first hole H1 of the passivation layer 310 may be the transmission hole TAH of the transmission portion TA.

Similar to the opposite electrode 223, the passivation layer 310 may have first patterns 310p spaced apart from each other with the first hole H1 therebetween, and each of the first patterns 310p may be arranged for each pixel group Pg to cover a corresponding pixel group Pg.

A first pattern 310p of the passivation layer 310 that covers the pixel group Pg may be formed to have a thickness that decreases in a direction toward an end of the first pattern 310p, namely, in a direction toward the upper surface of the substrate 100.

The passivation layer 310 may be arranged to cover the entire areas of the third and fourth holes H3 and H4 of the pixel defining layer 119 and the planarization layer 117 including an organic material, and the entire area of the fifth hole H5 formed in the inorganic insulating layer IL and the buffer layer 111.

According to the present embodiment, as holes are formed in the pixel defining layer 119, the planarization layer 117, and the inorganic insulating layer IL and the buffer layer 111, most of the layers on the substrate 100, excluding the substrate 100, may be removed from the area of the transmission portion TA, and thus the light transmittance in the transmission portion TA may improve.

Figure 8:
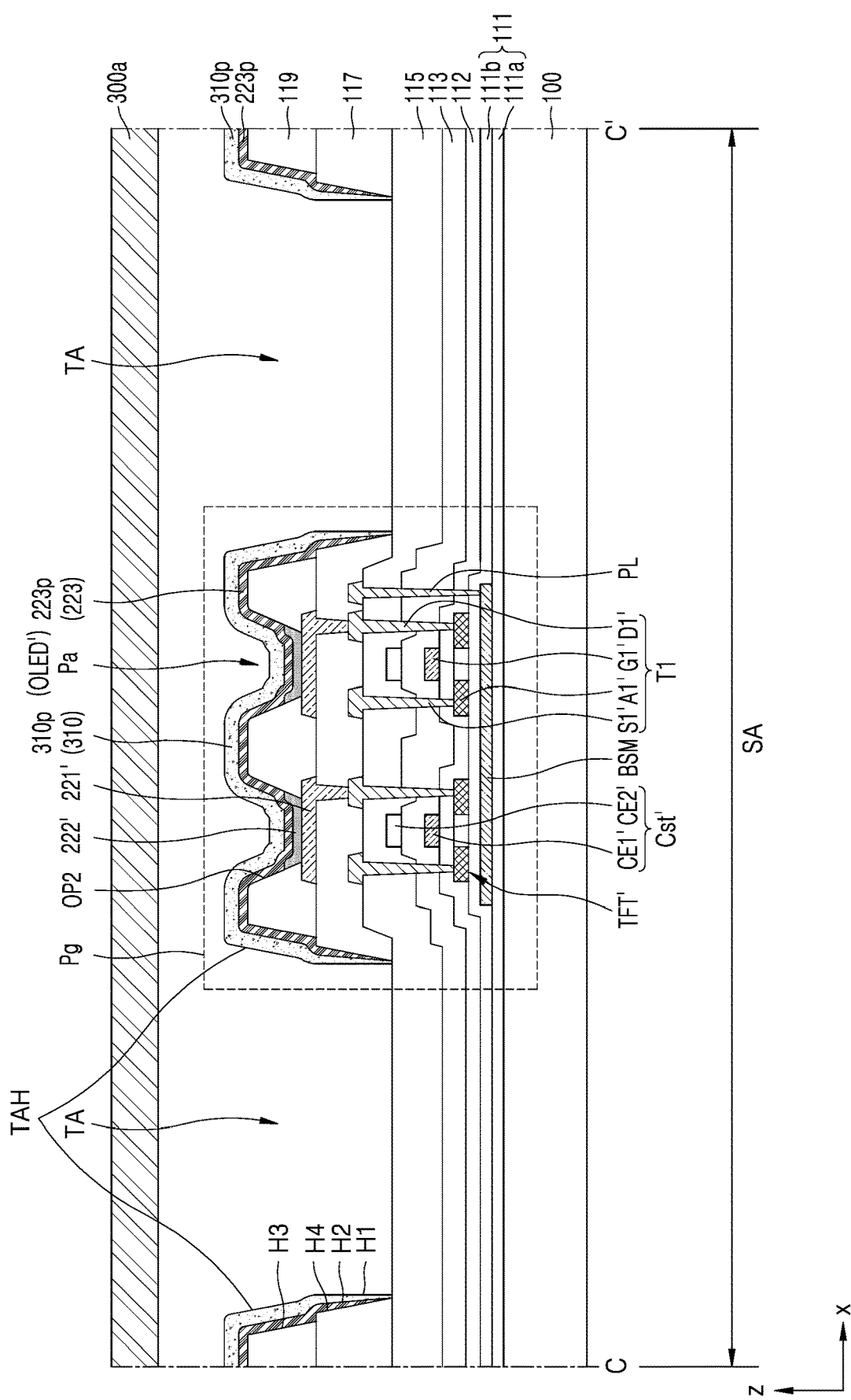
FIG. 8 is a schematic cross-sectional view of a display apparatus according to another example embodiment of the present invention.
Figure 9:
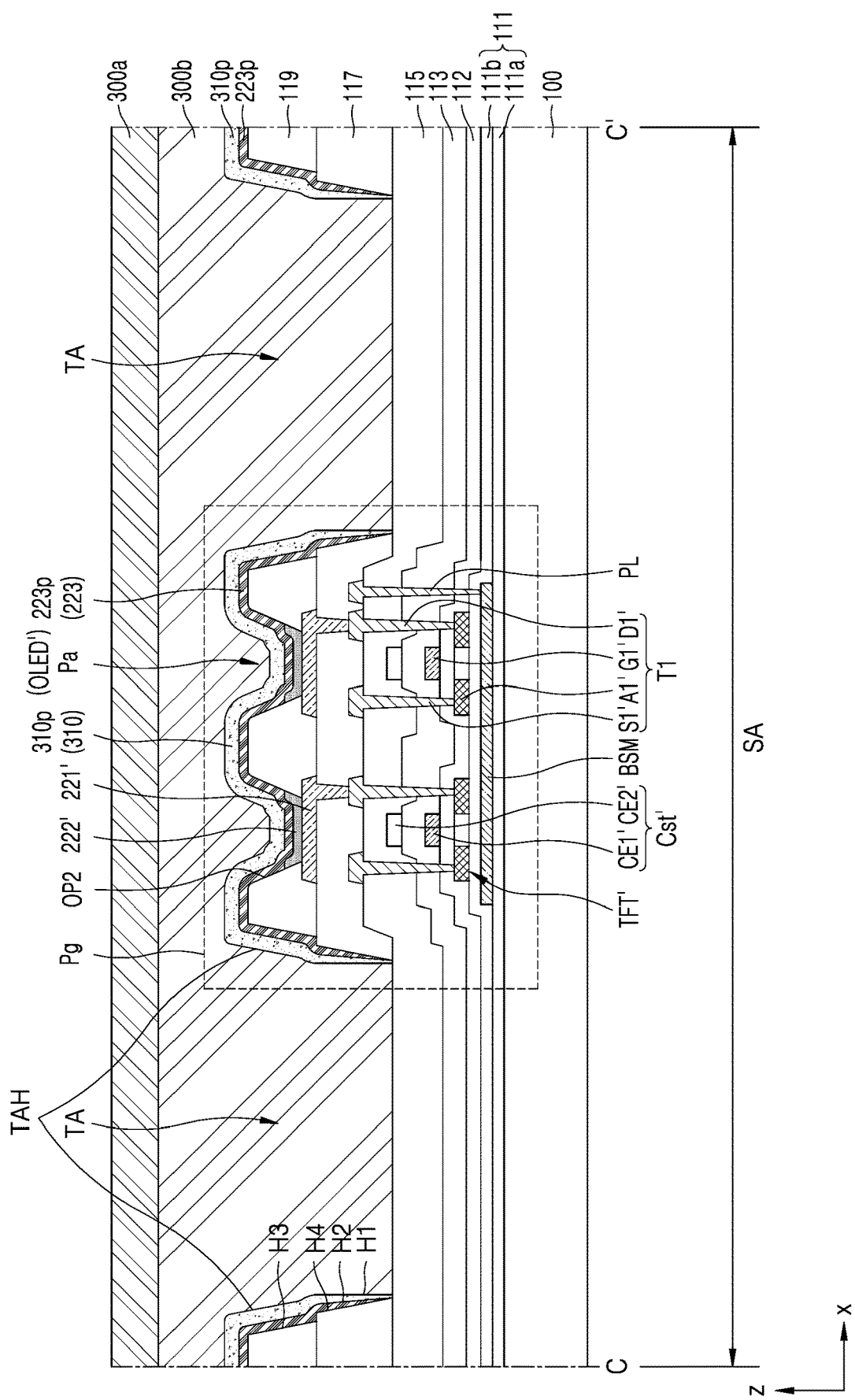
FIG. 9 is a schematic cross-sectional view of a display apparatus according to another example embodiment of the present invention.

FIGS. 8 and 9 are schematic cross-sectional views of display apparatuses according to other embodiments.

The embodiment of FIG. 8 has the same structure as or a similar structure to the embodiment of FIG. 6 except that an encapsulation substrate 300a instead of the encapsulation layer 300 encapsulates the display area DA of FIG. 3 and the sensor area SA. Accordingly, the embodiment of FIG. 8 will now be described in detail by focusing on differences with the embodiment of FIG. 6.

Referring to FIG. 8, the main organic light-emitting diode OLED of FIG. 4 of the display area of FIG. 3 and the auxiliary organic light-emitting diode OLED' of the sensor area SA may be covered by the encapsulation substrate 300a. The encapsulation substrate 300a includes a transparent material. For example, the encapsulation substrate 300a may include a glass material. In some examples, the encapsulation substrate 300a may include, for example, polymer resin. The encapsulation substrate 300a may prevent or substantially reduce infiltration of external moisture or foreign materials into the main organic light-emitting diode OLED and the auxiliary organic light-emitting diode OLED'.

A sealing material, such as a sealant, may be arranged between the substrate 100 having the main organic light-emitting diode OLED and the auxiliary organic light-emitting diode OLED' formed thereon and the encapsulation substrate 300a. The sealing material may block external moisture or foreign materials that may permeate between the substrate 100 and the encapsulation substrate 300a.

According to the present embodiment, an empty space may be formed between the passivation layer 310 and the encapsulation substrate 300a, and thus a spacer or the like may be further included on the entire area of the display apparatus such that a distance between the substrate 100 and the encapsulation substrate 300a may be constantly maintained.

The embodiment of FIG. 9 has the same structure as or a similar structure to the embodiment of FIG. 8 except that the passivation layer 310 and the encapsulation substrate 300a are filled with a filling material 300b. Accordingly, the embodiment of FIG. 9 will now be described in detail by focusing on differences with the embodiment of FIG. 8.

Referring to FIG. 9, the filling material 300b may fill a space between the passivation layer 310 and the encapsulation substrate 300a.

The filling material 300b may have various functions. According to an embodiment, the filling material 300b may reduce reflection of light emitted from the auxiliary organic light-emitting diode OLED' by a lower surface of the encapsulation substrate 300a (surface opposite to the substrate 100). To this end, the filling material 300b may have a refractive index between a refractive index of the passivation layer 310 and that of the encapsulation substrate 300a.

According to an embodiment, the filling material 300b may be a silicon-based resin, and may have a refractive index of about 1.5 to about 1.6.

In addition, the filling material 300b may serve as a buffer material preventing or substantially preventing the auxiliary organic light-emitting diode OLED' and the like from being damaged by external impacts. In this case, a component such as the spacer included in the embodiment of FIG. 8 may not be included.

The filling material 300b may be integrally formed to cover the sensor area SA and the display area DA of FIG. 3. As the filling material 300b is arranged between the passivation layer 310 and the encapsulation substrate 300a, the filling material 300b may be arranged within the transmission hole TAH.

According to another embodiment, the filling material 300b may be formed to cover the sensor area SA except for the display area DA of FIG. 3.

According to another embodiment, the filling material 300b may be formed to cover the sensor area SA but may not exist in the transmission portion TA. In other words, the filling material 300b may include a hole corresponding to the transmission portion TA.

A method of manufacturing the display apparatus 1 according to the embodiment of FIG. 6 will now be described in detail with reference to FIGS. 10A through 10I.

FIGS. 10A through 10I are cross-sectional views for describing a method of manufacturing a display apparatus according to an embodiment.

Figure 10A:
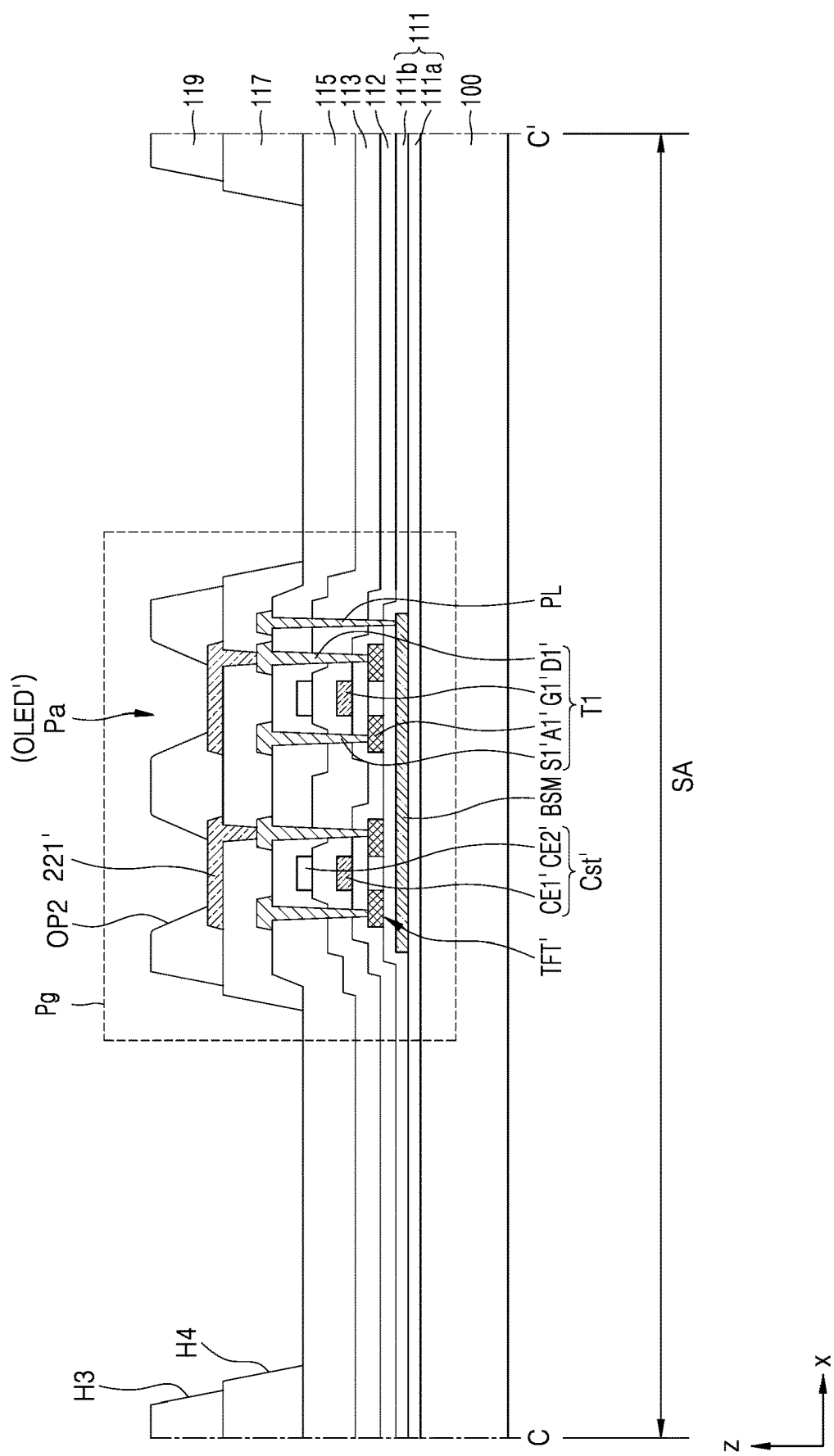
FIGS. 10A through 10I are cross-sectional views for describing a method of manufacturing a display apparatus according to an example embodiment of the present invention.

First, as shown in FIG. 10A, a backplane corresponding to the sensor area SA of the display apparatus 1 of FIG. 1 is prepared for. The backplane may be understood as including at least the substrate 100, the pixel electrodes 221' formed on the substrate 100, and the pixel defining layer 119 exposing at least a portion of each of the pixel electrodes 221', wherein the at least portion includes a center portion. The pixel defining layer 119 may protrude farther than the pixel electrodes 221' with respect to the substrate 100.

For example, the pixel electrodes 221' are formed on the planarization layer 117, and the pixel defining layer 119 is formed on the pixel electrodes 221' and the planarization layer 117 such that a height from the planarization layer 117 to an upper surface of the pixel defining layer 119 is greater than a height from the planarization layer 117 to upper surfaces of the pixel electrodes 221'.

An opening exposing at least a portion of each of the pixel electrodes 221' and the third hole H3 corresponding to the transmission portion TA of FIG. 6 are formed in the pixel defining layer 119. The fourth hole H4 corresponding to the transmission portion TA of FIG. 6 may be formed in the planarization layer 117 below the pixel defining layer 119. The third and fourth holes H3 and H4 may be formed in the pixel defining layer 119 and the planarization layer 117 by using any of several methods, one of which is a photoresist process which will be described later with reference to FIGS. 10C through 10E may be used.

In addition to the pixel defining layer 119 and the planarization layer 117 having the third and fourth holes H3 and H4 corresponding to the transmission portion TA of FIG. 6, at least one layer from among the layers below the planarization layer 117, for example, the interlayer insulating layer 115, the second gate insulating layer 113, the first gate insulating layer 112, the second buffer layer 111b, and the first buffer layer 111a, may also have a hole corresponding to the transmission area TA of FIG. 6.

In the backplane, the auxiliary thin-film transistor TFT' or the auxiliary storage capacitor Cst' may be formed on the substrate 100. The backplane may further include, for example, the buffer layer 111 for preventing impurities from permeating into the semiconductor layer A1' of the auxiliary thin-film transistor TFT', the first and second gate insulating layers 112 and 113 for insulating the semiconductor layer A1' of the auxiliary thin-film transistor TFT' from the gate electrode G1', the interlayer insulating layer 115 for insulating source and drain electrodes of the thin-film transistor TFT' from a gate electrode thereof, and the planarization layer 117 for covering the thin-film transistor TFT' and having an approximately flat upper surface.

Although the backplane corresponds to the sensor area SA of the substrate 100 in FIG. 10A, the backplane may be an extension to the display area DA of FIG. 1 of the substrate 100. In other words, the backplane of the auxiliary pixels Pa arranged in the sensor area SA and a backplane of the main pixels Pm of FIG. 1 arranged in the display area DA of FIG. 1 may be formed via the same process.

Figure 10B:
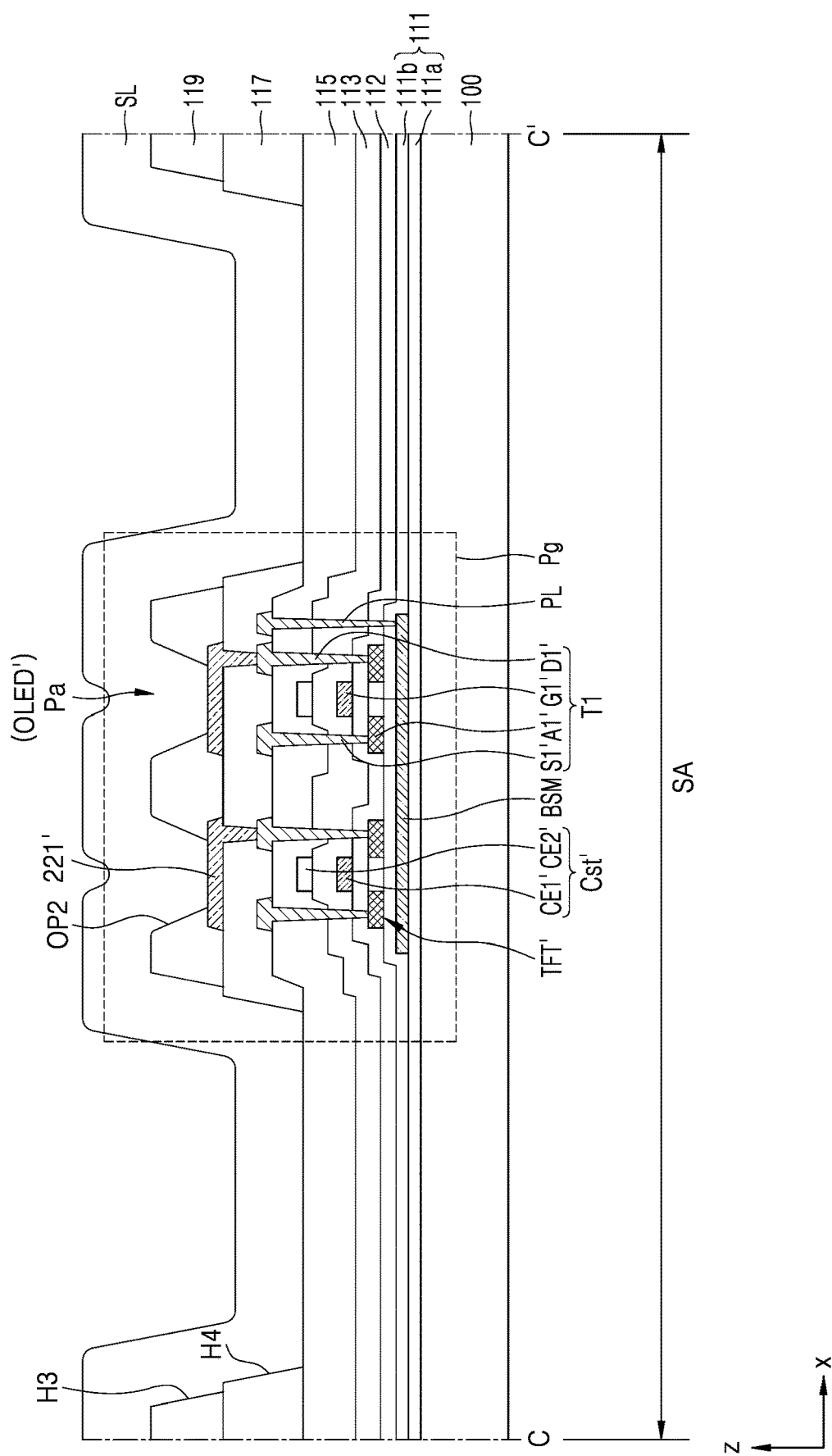
Figure 10C:
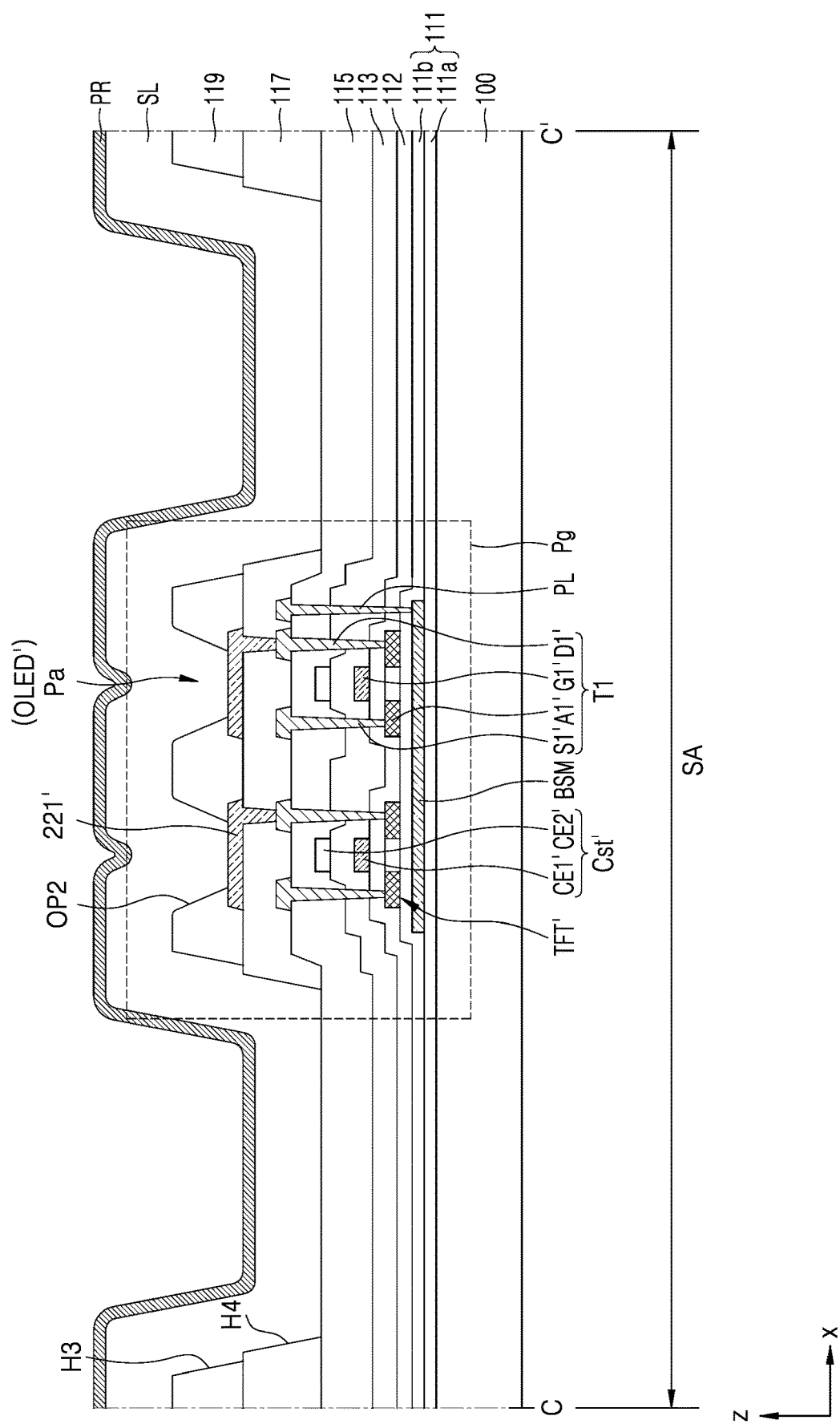

Next, as shown in FIG. 10B, a sacrificial layer SL is formed to correspond to the pixel electrodes 221' and the pixel defining layer 119. As shown in FIG. 10C, a photoresist layer PR is formed on the sacrificial layer SL.

The sacrificial layer SL may include highly-fluorinated resin or fluorinated polymer (or fluoropolymer) containing 20 wt % to 60 wt % fluorine. This material may have a significant amount of fluorinated carbon that does not physically/chemically react with a material of the emission layer included in the intermediate layer 222' of FIG. 6. Thus, when the intermediate layer 222' of FIG. 6 including an emission layer is formed during a subsequent process (see FIG. 10F), the material may not damage the intermediate layer 222' of FIG. 6, or, even if damage occurs, the degree of the damage may be reduced or minimized. The sacrificial layer SL may be formed on the substrate 100 by, for example, coating, printing, or deposition.

Figure 10D:
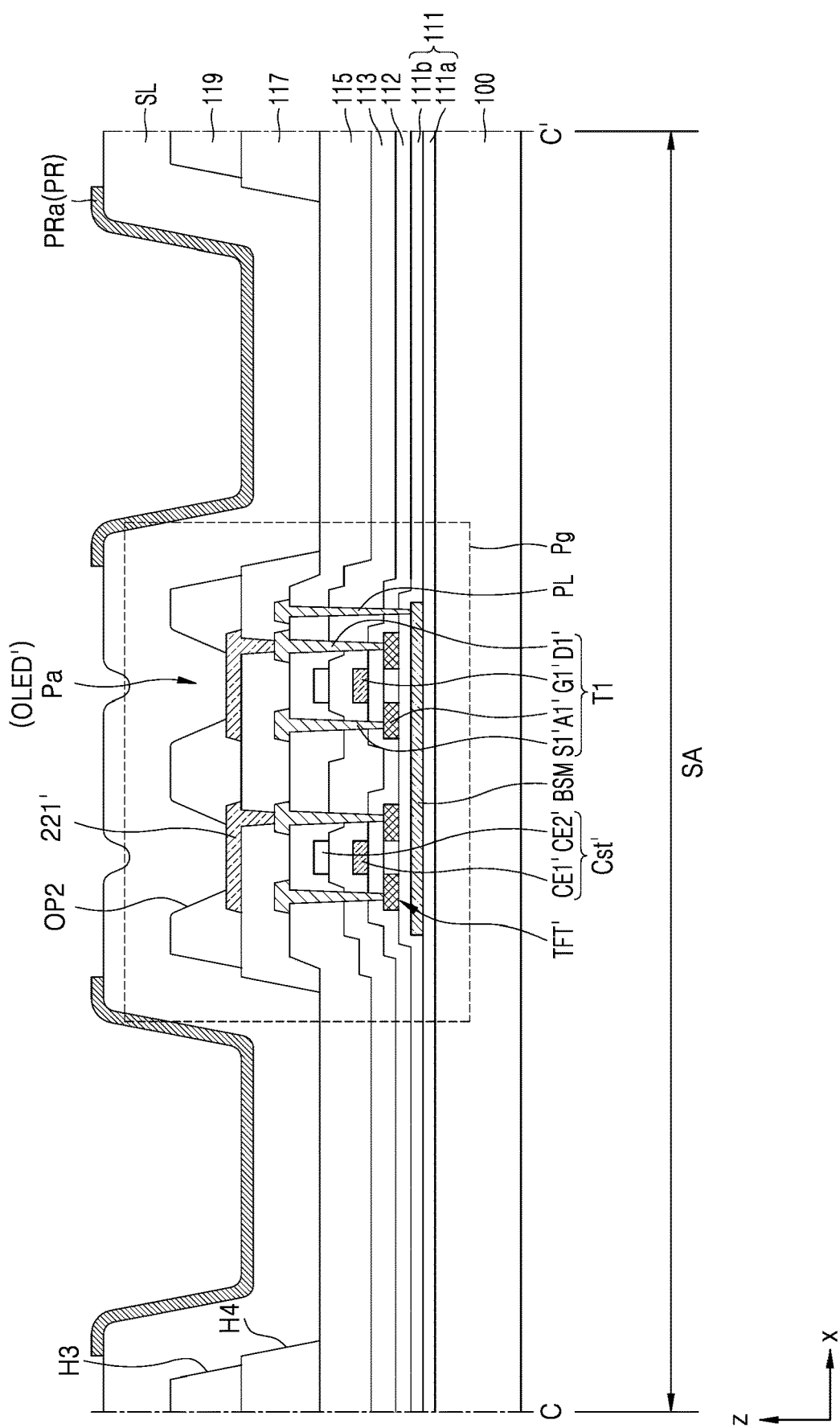

Next, as shown in FIG. 10D, the photoresist layer PR of FIG. 10C formed on the sacrificial layer SL is partially exposed and developed using a photomask or the like to thereby form a patterned photoresist layer PRa.

In this operation, a portion of the photoresist layer PR of FIG. 10C that corresponds to the transmission portion TA of FIG. 6 remains, and a portion of the photoresist layer PR of FIG. 10C that corresponds to the auxiliary pixels Pa is removed. The patterned photoresist layer PRa may be formed to have a larger width in the x direction than the transmission portion TA of FIG. 6.

Figure 10E:
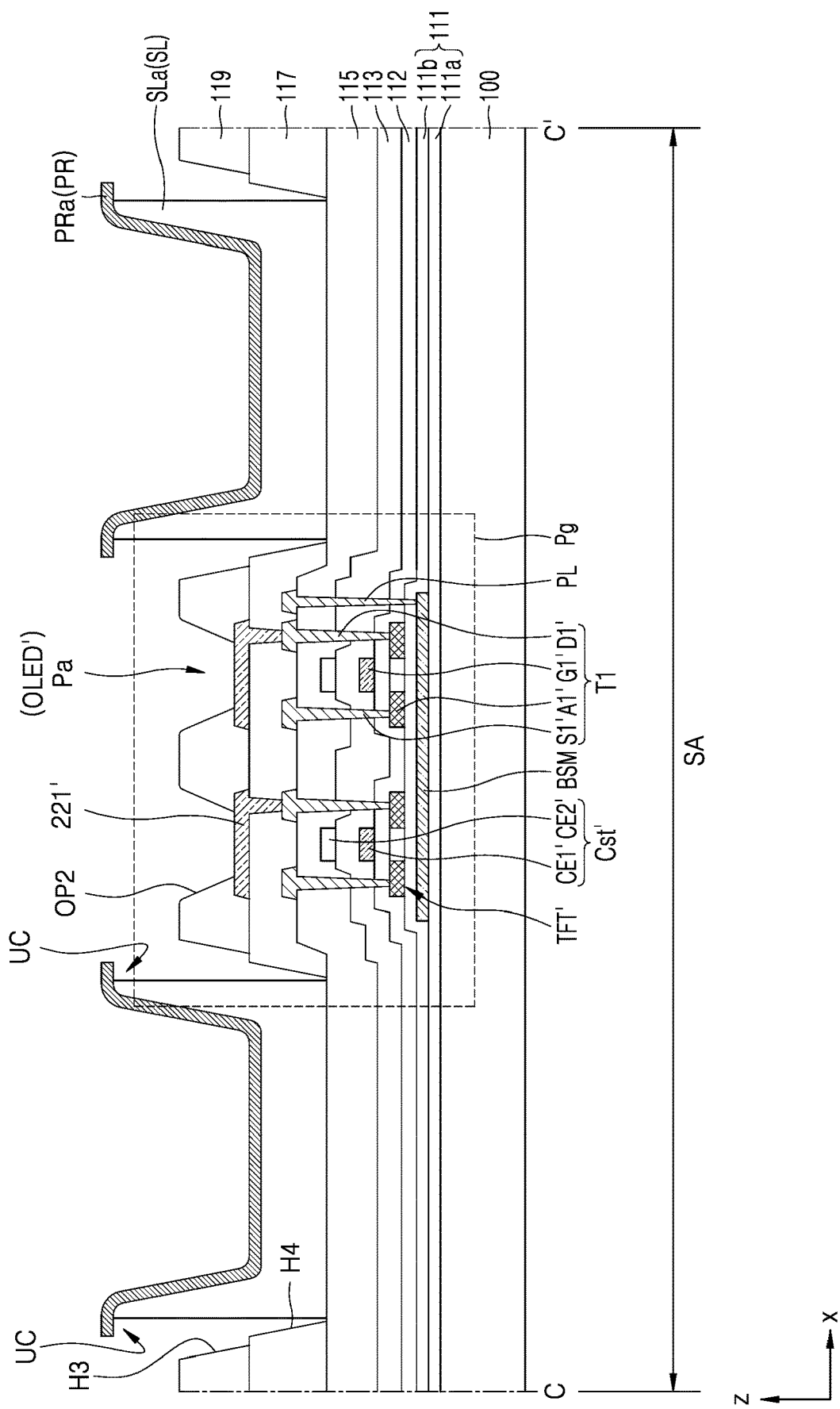

Next, as shown in FIG. 10E, the sacrificial layer SL of FIG. 10D is patterned using the patterned photoresist layer PRa as a mask to thereby form a patterned sacrificial layer SLa.

Similar to the previous operation (see FIG. 10D), in this operation, a portion of the sacrificial layer SL of FIG. 10D that corresponds to the transmission portion TA of FIG. 6 remains, and a portion of the sacrificial layer SL of FIG. 10D that corresponds to the auxiliary pixels Pa is removed. At this time, a plurality of auxiliary pixels Pa form a pixel group Pg. A width of the patterned sacrificial layer SLa in the x direction may be almost the same as that of the transmission hole TAH of FIG. 6 in the x direction.

When the sacrificial layer SL of FIG. 10D is removed, a solvent capable of etching fluoropolymer included in the sacrificial layer SL of FIG. 10D may be used. Examples of the solvent may include hydrofluoroethers (HFEs).

The patterned sacrificial layer SLa formed in this operation and the patterned photoresist layer PRa located on the patterned sacrificial layer SLa form an undercut cross-section UC. For example, the patterned photoresist layer PRa may be formed to have a greater width in the x direction than the patterned sacrificial layer SLa, and thus the undercut cross-section UC may be formed at the boundary between the patterned photoresist layer PRa and the patterned sacrificial layer SLa. As another example, an upper portion of the patterned sacrificial layer SLa may be formed to have a greater width in the x direction than a lower portion of the patterned sacrificial layer SLa, and thus the patterned sacrificial layer SLa itself may form the undercut cross-section UC.

The patterned sacrificial layer SLa may be formed to expose at least a portion of the pixel group Pg constituted by auxiliary pixels Pa and cover the third hole H3 included in the pixel defining layer 119 or the fourth hole H4 included in the planarization layer 117.

Figure 10F:
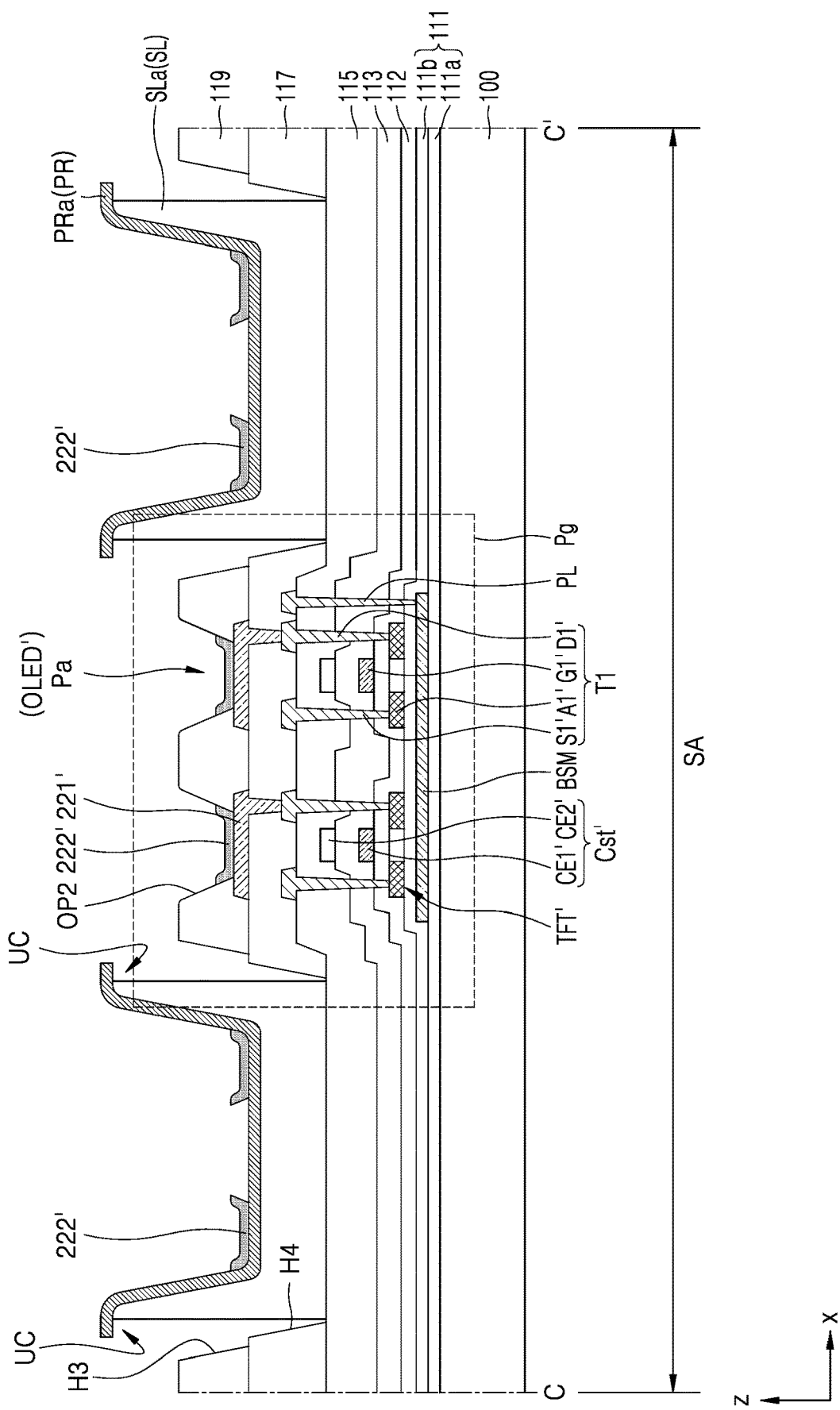

Next, as shown in FIG. 10F, the intermediate layer 222' including an emission layer is formed on the patterned sacrificial layer SL of FIG. 10D and the patterned photoresist layer PRa.

In this operation, the intermediate layer 222' is formed not only on an area corresponding to the transmission portion TA of FIG. 6 but is also formed to correspond to each of the auxiliary pixels Pa arranged in the sensor area SA and each of the main pixels Pm of FIG. 1 arranged in the display area DA of FIG. 1.

The emission layer of the intermediate layer 222' may be formed in various ways, for example, vacuum deposition.

Figure 10G:
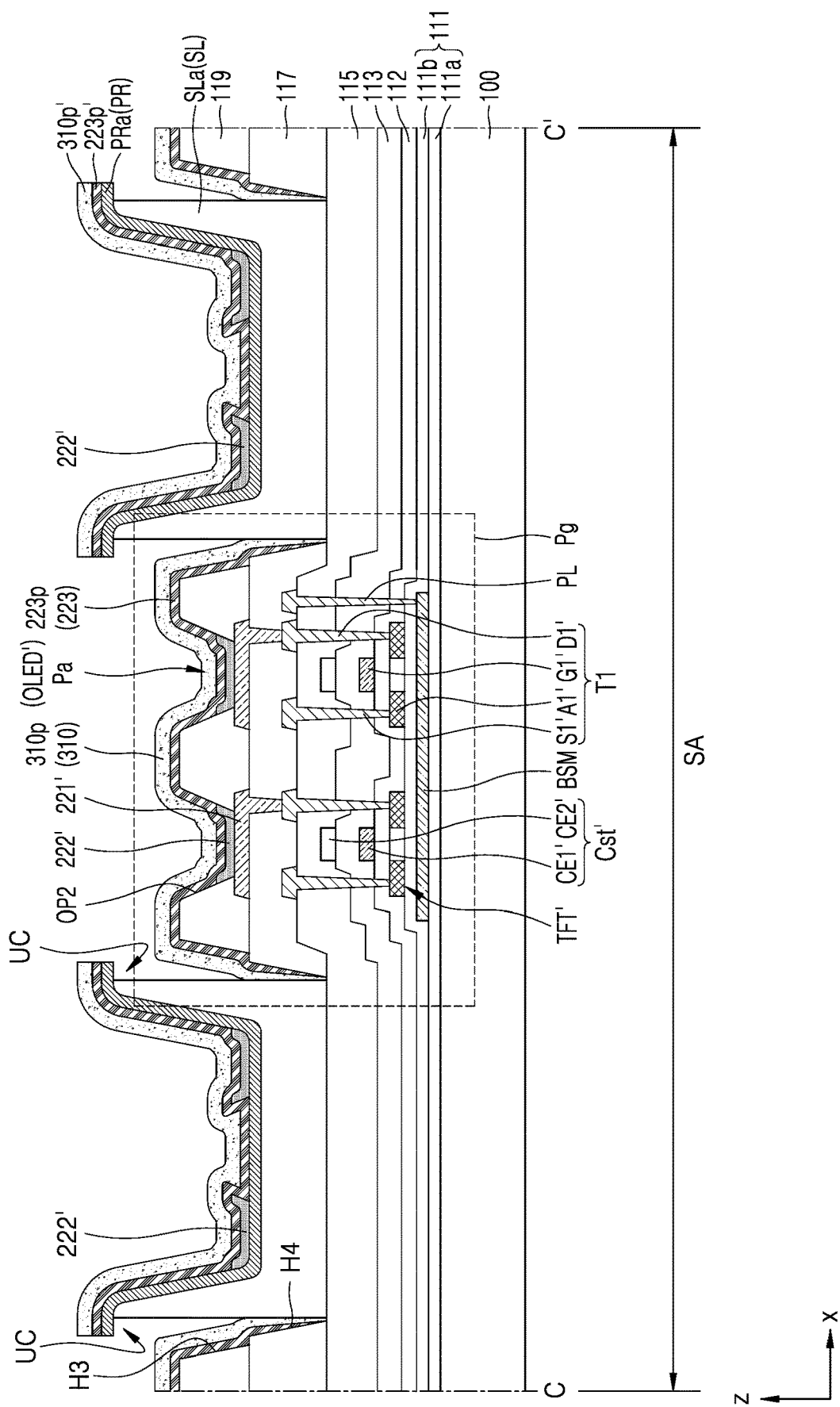

Next, as shown in FIG. 10G, opposite electrodes 223p and 223p' are formed in the area corresponding to the transmission portion TA of FIG. 6 and an area corresponding to the pixel group Pg, and passivation layers 310p and 310p' are formed on the opposite electrodes 223p and 223p'.

In this operation, the opposite electrodes 223p and 223p' and the passivation layers 310p and 310p' formed on the entire surface of the substrate 100 discontinue around the undercut cross-section UC of FIG. 10E of the patterned photoresist layer PRa and the patterned sacrificial layer SLa formed in the previous operation (see FIG. 10E).

Thus, the opposite electrodes 223p and 223p' are spaced apart from each other with the second hole H2 therebetween to form the second patterns 223p covering the pixel group Pg, and the passivation layers 310p and 310p' are spaced apart from each other with the first hole H1 therebetween to form the first patterns 310p covering the pixel group Pg.

An end of the first pattern 310p of the passivation layer 310 on the side of the first hole H1 may be formed to cover an end of the second pattern 223p of the opposite electrode 223 on the side of the second hole H2, and the first pattern 310p and the second pattern 223p may be formed to have respective thicknesses that decrease in a direction toward the respective ends thereof.

The opposite electrodes 223p and 223p' and the passivation layers 310p and 310p' may be formed to extend to the display area DA of FIG. 1 of the substrate 100. In other words, the opposite electrodes 223p and 223p' arranged in the sensor area SA and the opposite electrode 223 of the main pixel Pm of FIG. 4 arranged in the display area DA of FIG. 4 may be formed via the same process, and the passivation layers 310p and 310p' arranged in the sensor area SA and the first inorganic encapsulation layer 310 of the main pixel Pm of FIG. 4 arranged in the display area DA of FIG. 4 may be formed via the same process.

Figure 10H:
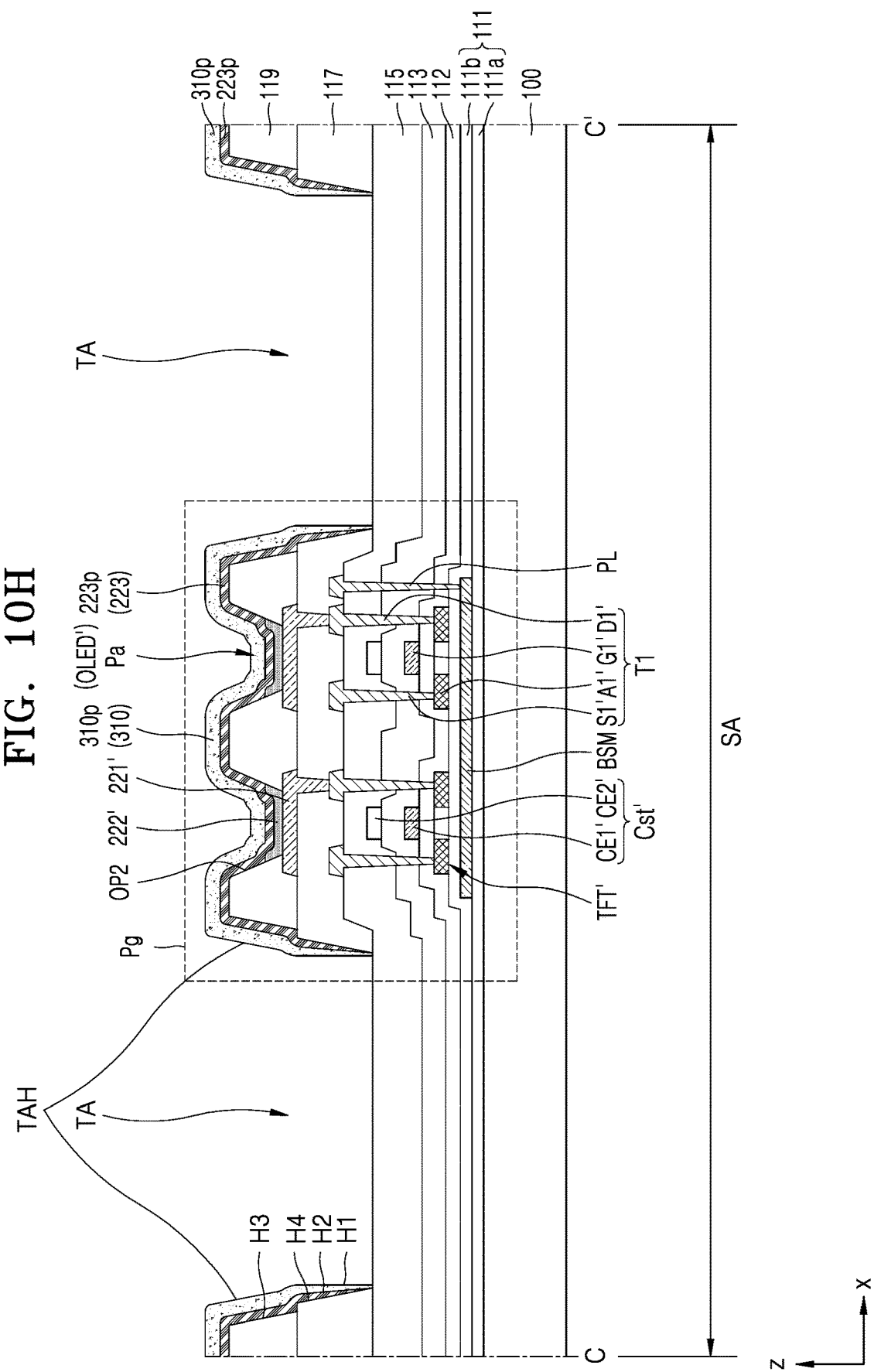

Next, as shown in FIG. 10H, the patterned sacrificial layer SLa is removed to form the transmission hole TAH in the transmission portion TA.

In this operation, as described above with reference to FIG. 10E, the patterned sacrificial layer SLa is completely removed using a solvent, such as HFEs capable of etching fluoropolymer.

The same solvent as the solvent used in FIG. 10E may be used as a solvent for removing a sacrificial layer, but embodiments are not limited thereto. A different solvent from the solvent used in FIG. 10E may be used. In this operation, a solvent having low reactivity with the emission layer included in the intermediate layer 222' may be used.

By removing the patterned sacrificial layer SLa as described above, the patterned photoresist layer PRa, the intermediate layer 222', the opposite electrode 223p', and the passivation layer 310p' located directly on the patterned sacrificial layer SLa may be easily removed.

Figure 10I:
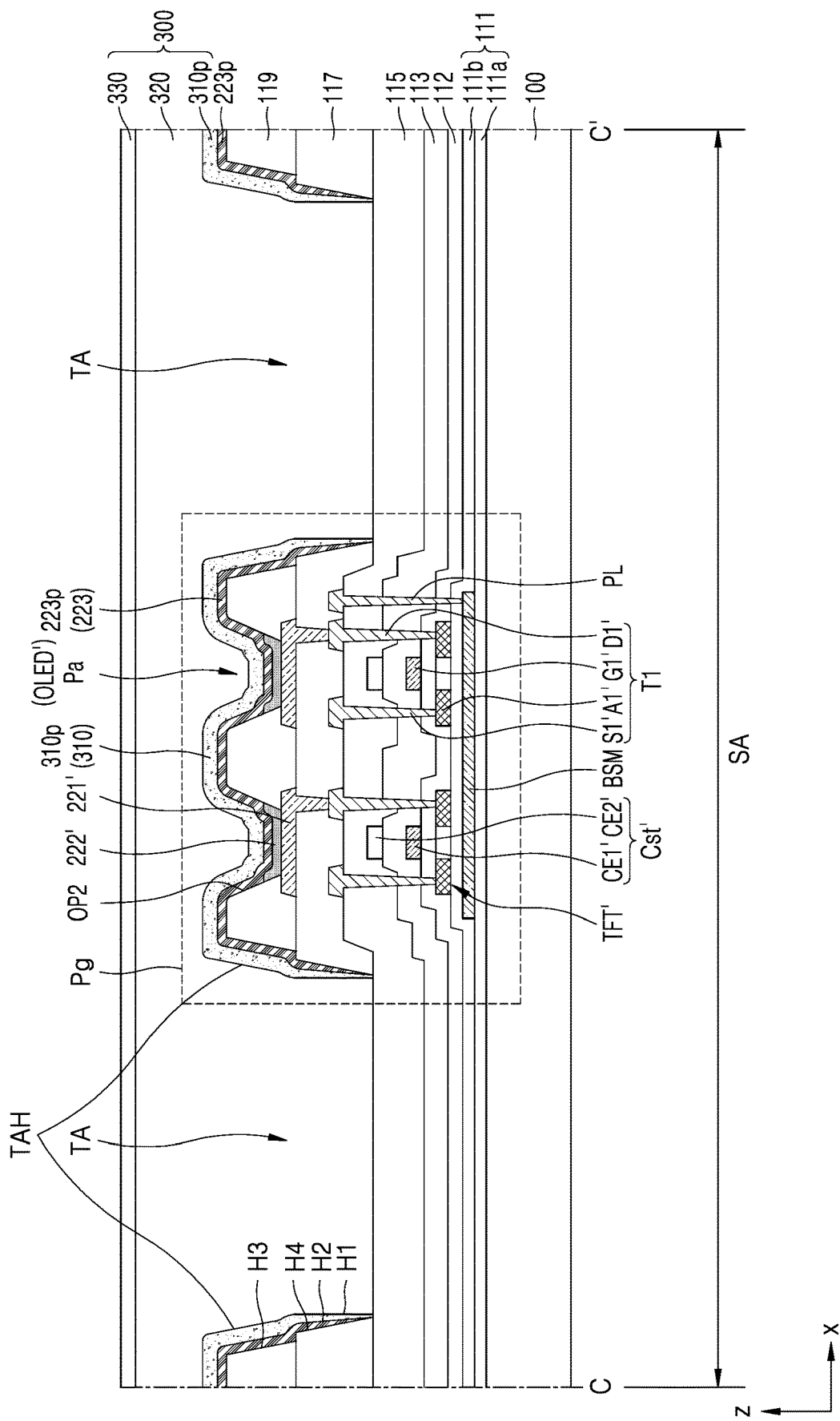

Next, as shown in FIG. 10I, the encapsulation layer 300 including an inorganic encapsulation layer and an organic encapsulation layer is formed on the first patterns 310p of the passivation layer 310.

When the embodiment of FIG. 10I is taken as an example, each first pattern 310p may function as the first inorganic encapsulation layer 310 covering the pixel group Pg, the organic encapsulation layer 320 may be formed on the first pattern 310p, and the second inorganic encapsulation layer 330 may be formed on the organic encapsulation layer 320.

However, in contrast with the embodiment of FIG. 10I, the encapsulation substrate 300a of FIG. 8 or a combination of the encapsulation substrate 300a of FIG. 9 and the filling material 300b of FIG. 9, instead of the encapsulation layer 300, may be formed on the passivation layer 310.

Through the processes of FIGS. 10A through 10I, an influence on the emission layer and the like may be reduced or minimized, and also the light transmittance of the transmission portion TA may be improved due to easy removal of organic and/or inorganic insulating layer located in the transmission portion TA.

Figure 11A:
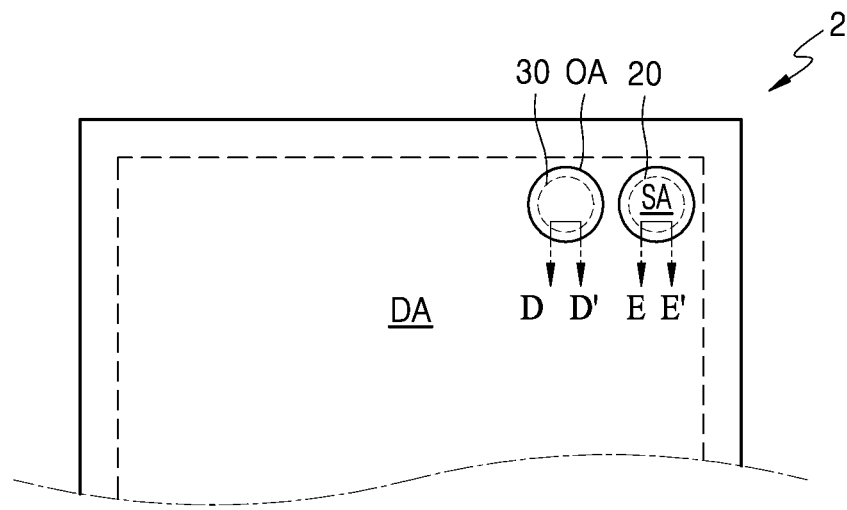
FIG. 11A is a schematic plan view of a display apparatus according to another example embodiment of the present invention.
Figure 11B:
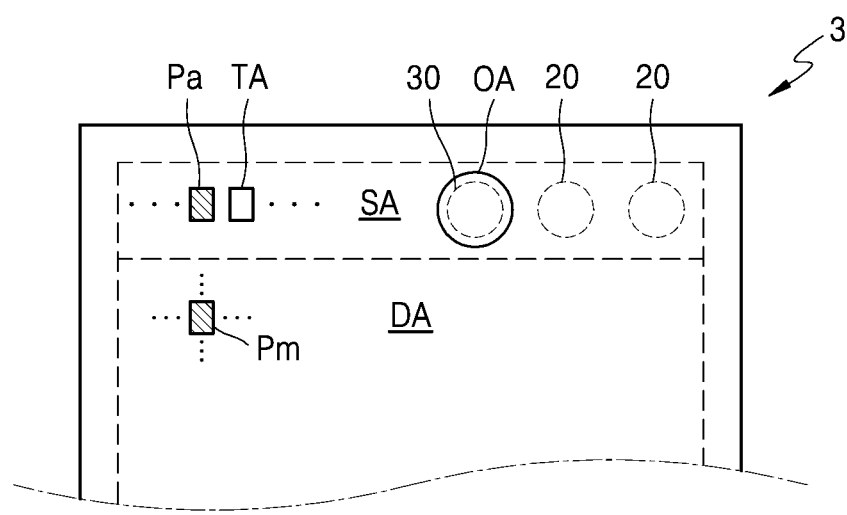
FIG. 11B is a schematic plan view of a display apparatus according to another example embodiment of the present invention.

FIG. 11A is a schematic plan view of a display apparatus 2 according to another embodiment. FIG. 11B is a schematic plan view of a display apparatus 3 according to another embodiment.

Referring to FIG. 11A, the display apparatus 2 may further include an opening area OA.

The opening area OA may be an area where a component 30 is arranged underneath the opening area OA. The opening area OA may be understood as a transmission area capable of transmitting light or/and sound that is output from the component 30 to the outside or travels from the outside toward the component 30. According to an embodiment, when light is transmitted through the opening area OA, a light transmittance in the opening area OA may be about 50% or greater, in more detail, 70% or greater, 75% or greater, 80% or greater, 85% or greater, or 90% or greater. The opening area OA is an area where no display elements are arranged, and thus may not provide an image. According to the present embodiment, the opening area OA may be arranged inside the display area DA, and may be surrounded by main pixels.

Also in a lower portion of the sensor area SA, the component 20 may be arranged. The sensor area SA may include auxiliary pixels arranged therein and thus may provide a certain image.

According to some embodiments, the light transmittance of the opening area OA may be greater than that of the sensor area SA. Accordingly, the component 30 benefiting from a high light transmittance, for example, a camera, may be arranged in the opening area OA, and a sensor that senses infrared light may be arranged in the sensor area SA.

Referring to FIG. 11B, the sensor area SA of the display apparatus 3 may include an area where the component 20 is arranged, and thus may be arranged on one side of the display area DA. The sensor area SA may be arranged to correspond to one side of the display area DA, and a plurality of components 20 may be arranged in the sensor area SA.

Because the sensor area SA includes the auxiliary pixel Pa and the transmission portion TA, the sensor area SA may provide an image with a lower resolution than the resolution of the display area DA.

The opening area OA may be included inside the sensor area SA. Because the opening area OA has a high light transmittance compared with the sensor area SA, the component 30 sensitive to light may be arranged in the opening area OA. The opening area OA may be surrounded by the auxiliary pixels Pa and the transmission portion TA. The opening area OA may have a larger area than the transmission portion TA.

Figure 12:
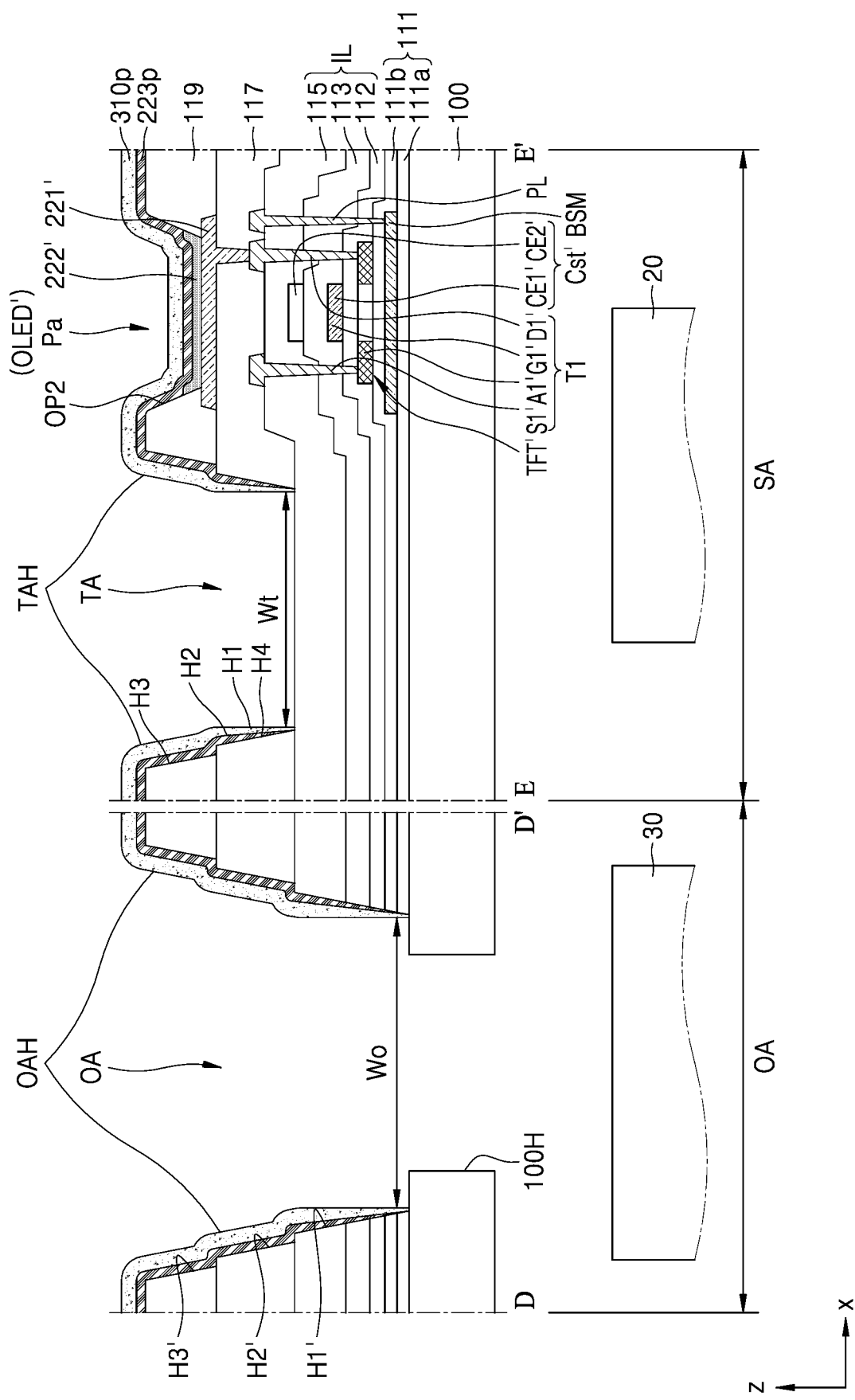
FIG. 12 is a cross-sectional view taken along the lines D-D' and E-E' of FIG. 11A.

FIG. 12 is a cross-sectional view taken along the lines D-D' and E-E' of FIG. 11A.

Referring to FIG. 12, the opening area OA may include an opening hole OAH corresponding to the opening area OA. A width Wo of the opening hole OAH in the x direction may be greater than a width Wt of the transmission hole TAH in the x direction. The opening hole OAH may overlap the entire area of each component 30, whereas the transmission hole TAH may overlap a portion of each component 20.

The opening area OA may include a substrate hole 100H that penetrates through the substrate 100. Because the opening area OA includes the substrate hole 100H, the light transmittance of the opening area OA may be greater than that of the sensor area SA. Accordingly, the component 30 benefiting from a high light transmittance may be arranged in the lower portion of the opening area OA.

In the lower portion of the sensor area SA, the component 20 may be arranged. The component 20 may be an infrared (IR) sensor that transmits/receives IR light. Because the transmission portion TA is arranged in the sensor area SA, the transmission portion TA may transmit an IR signal transmitted/received to/from the component 20. For example, light emitted from the component 20 may travel via the transmission portion TA in a z direction, and light generated by outside a display apparatus and incident upon the component 20 may travel via the transmission portion TA in a −z direction.

As described above, according to an embodiment of the present disclosure, a pixel portion and a transmission portion having an improved light transmittance are arranged in a sensor area corresponding to a component such as a sensor, and thus an environment where the component is operable may be established and also an image may be realized in an area that overlaps the component.

Thus, a display apparatus having various functions and an improved quality may be provided.

However, the scope of the present disclosure is not restricted by this effect.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art. Further, a specific quantity or range recited in this written description or the claims may also encompass the inherent variations in measured or calculated values that would be recognized by those of ordinary skill in the art.

As used herein, the terms "use," "using," and "used" may be considered synonymous with the terms "utilize," "utilizing," and "utilized," respectively.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification.

The display apparatus and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the display apparatus may be formed on one integrated circuit (IC) chip or on separate IC chips. Further, the various components of the display apparatus may be implemented on a flexible printed circuit film, a tape carrier package (TCP), a printed circuit board (PCB), or formed on a same substrate. Further, the various components of the display apparatus may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

While the inventive concept has been particularly shown and described with reference to exemplary embodiments thereof, it will be understood by those of ordinary skill in the art that various changes in form and details may be made therein without departing from the spirit and scope as defined by the following claims and equivalents thereof.

What is claimed is:

1. A method of manufacturing a display apparatus comprising a plurality of first display devices, a display device group comprising a plurality of second display devices, and a transmission portion that transmits light, the method comprising:
    forming a plurality of pixel electrodes on a substrate comprising a display area in which the plurality of first display devices are arranged and a sensor area in which the display device group and the transmission portion are arranged;
    forming a pixel defining layer on the plurality of pixel electrodes, the pixel defining layer having an opening exposing at least a portion of each of the plurality of pixel electrodes and a hole corresponding to the transmission portion;
    forming a sacrificial layer on the pixel defining layer;
    patterning the sacrificial layer such that at least some of the pixel electrodes of the display device group are exposed and the hole is covered;
    forming a passivation layer on the patterned sacrificial layer; and
    forming in the passivation layer a first hole corresponding to the transmission portion by removing the patterned sacrificial layer,
    wherein the passivation layer covers the display device group and has first patterns spaced from each other with the first hole between the first patterns.

2. The method of claim 1, wherein the patterning of the sacrificial layer comprises:
    forming a photoresist layer on the sacrificial layer; and
    patterning the photoresist layer to correspond to the transmission portion,
    wherein the patterned sacrificial layer is formed by using a patterned photoresist layer such that a portion of the sacrificial layer corresponding to the transmission portion remains.

3. The method of claim 2, wherein the forming of the patterned sacrificial layer comprises forming an undercut cross-section of the patterned sacrificial layer and the patterned photoresist layer.

4. The method of claim 1, wherein the forming of the passivation layer on the patterned sacrificial layer comprises:
    forming an emission layer on the plurality of pixel electrodes and the patterned sacrificial layer;
    forming an opposite electrode on emission layer; and
    forming the passivation layer on the opposite electrode.

5. The method of claim 1, further comprising, before the forming of the plurality of pixel electrodes, forming a lower hole by removing a portion of at least one of a plurality of insulating layers formed on the substrate, the portion corresponding to the transmission portion.

6. The method of claim 1, further comprising forming, on the passivation layer, an encapsulation layer comprising an inorganic encapsulation layer and an organic encapsulation layer,
    wherein the encapsulation layer covers the display area and the sensor area.

7. The method of claim 1, further comprising arranging, on the passivation layer, an encapsulation substrate opposite the substrate,
    wherein the encapsulation substrate covers the display area and the sensor area.

8. The method of claim 7, further comprising forming a filling material filled between the passivation layer and the encapsulation substrate,
    wherein the filling material has a refractive index between a refractive index of the passivation layer and a refractive index of the encapsulation substrate.

* * * * *